(12) United States Patent
Ito et al.

(10) Patent No.: US 7,223,668 B2
(45) Date of Patent: May 29, 2007

(54) METHOD OF ETCHING METALLIC THIN FILM ON THIN FILM RESISTOR

(75) Inventors: Ichiro Ito, Anjo (JP); Satoshi Shiraki, Toyohashi (JP)

(73) Assignee: DENSO COrporation, Kariya (JP)

( * ) Notice: Subject to any disclaimer, the term of this patent is extended or adjusted under 35 U.S.C. 154(b) by 125 days.

(21) Appl. No.: 10/944,665

(22) Filed: Sep. 17, 2004

(65) Prior Publication Data

US 2005/0042882 A1 Feb. 24, 2005

Related U.S. Application Data

(62) Division of application No. 10/131,683, filed on Apr. 24, 2002, now Pat. No. 6,809,034, which is a division of application No. 09/361,980, filed on Jul. 28, 1999, now Pat. No. 6,770,564.

(30) Foreign Application Priority Data

| Jul. 29, 1998 | (JP) | ................................. 10-214495 |
| Jul. 31, 1998 | (JP) | ................................. 10-217725 |
| Sep. 29, 1998 | (JP) | ................................. 10-276083 |

(51) Int. Cl.
*H01L 21/467* (2006.01)

(52) U.S. Cl. .................... 438/384; 438/738; 438/745; 257/E21.004

(58) Field of Classification Search ................. 438/384
See application file for complete search history.

(56) References Cited

U.S. PATENT DOCUMENTS

| 4,473,940 A | 10/1984 | Kiriseko ...................... 438/363 |
| 4,671,852 A | 6/1987 | Pyke ............................ 438/49 |
| 4,682,402 A * | 7/1987 | Yamaguchi .................. 438/384 |
| 4,878,770 A | 11/1989 | Ruggierio et al. ........... 338/307 |
| 4,986,877 A | 1/1991 | Tachi et al. .................. 438/713 |
| 5,043,295 A | 8/1991 | Ruggerio et al. ............ 604/265 |
| 5,372,673 A | 12/1994 | Stager et al. ................. 438/8 |

(Continued)

FOREIGN PATENT DOCUMENTS

JP              61280620          12/1986

(Continued)

OTHER PUBLICATIONS

Office Action dated Dec. 10, 2002 in Japanese Patent Application No. 10-217725 with English translation.

(Continued)

*Primary Examiner*—Stephen W. Smoot
(74) *Attorney, Agent, or Firm*—Harness, Dickey & Pierce, PLC

(57) ABSTRACT

An Al film is formed on a barrier metal covering a thin film resistor to have a first opening. A photo-resist is formed on the Al film and in the opening, and is patterned to have a second opening having an opening area smaller than that of the first opening and open in the first opening to expose the barrier metal therefrom. Then, the barrier metal is etched through the second opening. Because the barrier metal is etched from an inner portion more than the opening end of the first opening, under-cut of the barrier metal is prevented.

8 Claims, 20 Drawing Sheets

U.S. PATENT DOCUMENTS

| | | | |
|---|---|---|---|
| 5,382,916 A | 1/1995 | King et al. | 330/253 |
| 5,420,063 A | 5/1995 | Maghsoudnia et al. | 438/384 |
| 5,468,672 A * | 11/1995 | Rosvold | 438/385 |
| 5,500,553 A * | 3/1996 | Ikegami | 257/538 |
| 5,503,878 A | 4/1996 | Suzuki et al. | 216/16 |
| 5,525,831 A | 6/1996 | Ohkawa et al. | 257/543 |
| 5,547,896 A * | 8/1996 | Linn et al. | 438/384 |
| 5,648,281 A | 7/1997 | Williams et al. | 438/328 |
| 5,989,970 A | 11/1999 | Ohkawa et al. | |
| 6,242,792 B1 | 6/2001 | Miura et al. | |
| 6,242,793 B1 | 6/2001 | Colombo et al. | |
| 6,274,452 B1 | 8/2001 | Miura et al. | |

FOREIGN PATENT DOCUMENTS

| | | | | |
|---|---|---|---|---|
| JP | 63062746 A | 3/1988 | | 347/200 |
| JP | 2-58259 | 2/1990 | | |
| JP | 02-213138 | 8/1990 | | |
| JP | 03012960 A | 1/1991 | | 257/537 |
| JP | 03-222414 | 10/1991 | | |
| JP | 04157723 A | 5/1992 | | |
| JP | 06-005599 | 1/1994 | | |
| JP | 7-202124 | 8/1995 | | |
| JP | 07335831 A | * 12/1995 | | |
| JP | 8-250462 | 9/1996 | | |
| JP | 10144866 A | * 5/1998 | | |

OTHER PUBLICATIONS

Office Action dated Aug. 5, 2003 in Japanese Patent Application No. 10-276083 with English translatino.

Notice of Reason of Rejection, Mailing Date: Sep. 3, 2002, Mailing No. 270676.

Nagahata, Preparation of Thermal Head, English Abstract of JP 63062746 A, 2 pages.

Iida, Semiconductor Device and Manufacture Thereof, English Abstract of JP 3012960 A, 2 pages.

Decision for Refusal dated Jun. 6, 2006 in Japanese Application No. 10-214495 with English translation.

* cited by examiner

METHOD OF ETCHING METALLIC THIN FILM ON THIN FILM RESISTOR

CROSS REFERENCE TO RELATED APPLICATIONS

This application is a divisional of U.S. patent application Ser. No. 10/131,683 filed Apr. 24, 2002, now U.S. Pat. No. 6,809,034 which is a divisional of U.S. patent application Ser. No. 09/361,980 filed Jul. 28, 1999, which is now U.S. Pat. No. 6,770,564 which is based upon and claims the benefit of Japanese Patent Applications No. 10-214495 filed on Jul. 29, 1998, No. 10-217725 filed on Jul. 31, 1998, and No. 10-276083 filed on Sep. 29, 1998, the contents of which are incorporated herein by reference.

BACKGROUND OF THE INVENTION

1. Field of the Invention

This invention relates to a method of manufacturing a semiconductor device having a thin film resistor, and particularly to a method of etching a metallic thin film on the thin film resistor.

2. Description of the Related Art

A conventional method of manufacturing a CrSi resistor device including a CrSi resistor and a TiW barrier metal will be explained referring to FIGS. 1A to 1D. First, as shown in FIG. 1A, a CrSi film is deposited on a silicon substrate 101 through a silicon oxide film 102 interposed therebetween, and is patterned in to a shape of a CrSi resistor 103. Then, as shown in FIG. 1B, a TiW film 104 as barrier metal is deposited to cover the CrSi resistor 103, and an Al film 105 is deposited as electrodes. After that, as shown in FIG. 1C, the Al film 105 is patterned by etching using a photo-resist 106 as a mask. As shown in FIG. 1D, an unnecessary part of the TiW film 104 is further removed by wet etching using the photo-resist 106 as a mask again.

FIG. 2 is an enlarged view showing a portion around the CrSi resistor 103 formed by the conventional method described above. As shown in the figure, the conventional method is accompanied by Al over-hanging such that the Al film 105 is inversely tapered by the wet etching for the TiW film 104, and TiW under-cut such that the etching of the TiW film 104 progresses under the Al film 105. As a result, the Al film 105 and the TiW film 104 form an inversely tapered cross-sectional shape as a whole. The inversely tapered cross-sectional shape adversely affect a shape of an intermediate insulation film which covers the CrSi resistor device, and further affects not only a shape of a wiring pattern formed on the insulation film but also a shape of a protective film for covering the wiring pattern. This may result in breakage of the wiring pattern and cracks in the protective film.

Further, as shown in FIG. 3, when the under-cut amount of the TiW film 104 is large, it becomes difficult for an intermediate insulation film 108 to fill the under-cut portion. This results in deterioration of step-coverage, and allows invasion of water or the like. As a result, the reliability of the device is lowered. Incidentally, FIG. 3 omits the over-hanging portion of the Al film 105.

SUMMARY OF THE INVENTION

The present invention has been made in view of the above problems. An object of the present invention is to prevent under-cut of a barrier metal from being produced by etching of the barrier metal. Another object of the present invention is to prevent over-hanging of a conductive film from being produced by etching of the barrier metal. Still another object of the present invention is to provide a semiconductor device including a thin film resistor with high reliability.

According to a first aspect of the present invention, a first opening is formed in a conductive film to expose a metallic film (barrier metal) that is formed on a thin film resistor, and then a mask is formed on the conductive film with a second opening having an opening area smaller than that of the first opening and open in the first opening to expose the metallic film therefrom. Then, the metallic film is etched through the second opening. Accordingly, because the metallic film is etched from an inner portion more than the opening end of the first opening, the metallic film underlying the conductive film is hardly etched, thereby preventing under-cut of the metallic film.

According to a second aspect of the present invention, after a first part of a metallic film is dry-etched through an opening of a conductive film, a second part of the metallic film directly contacting a thin film resistor is wet-etched. Because a side etching amount produced by dry-etching is smaller than that produced by wet-etching, a variation in the side etching amount produced during the etching of the metallic film is decreased. As a result, a variation in a contact width between the metallic film and the thin film resistor is decreased, thereby achieving high reliability of a semiconductor device.

According to a third aspect of the present invention, a conductive film is formed on a metallic film to have a thickness equal to or less than 300 nm, and the conductive film is patterned to have an upper surface area, a ratio of which relative to an upper surface area of a thin film resistor is equal to or more than 0.02. Then, the metallic film is etched through an opening of the conductive film. Accordingly, a variation in an etching amount produced due to a battery effect between the conductive film and the metallic film is decreased to prevent over-hanging of the conductive film and under-cut of the metallic film.

According to a fourth aspect of the present invention, after a surface portion of a metallic film is oxidized to form a surface oxide layer, a conductive film is formed on the surface oxide layer. Then, the surface oxide layer and the metallic film are wet-etched through an opening of the conductive film. In this case, a potential difference produced between the metallic film and the conductive film at the wet-etching step is decreased by the surface oxide layer. As a result, the conductive film is prevented from being etched during the wet-etching step, thereby preventing the over-hanging of the conductive film.

BRIEF DESCRIPTION OF THE DRAWINGS

Other objects and features of the present invention will become more readily apparent from a better understanding of the preferred embodiments described below with reference to the following drawings.

DETAILED DESCRIPTION OF THE PREFERRED EMBODIMENTS

First Embodiment

Figure 4:
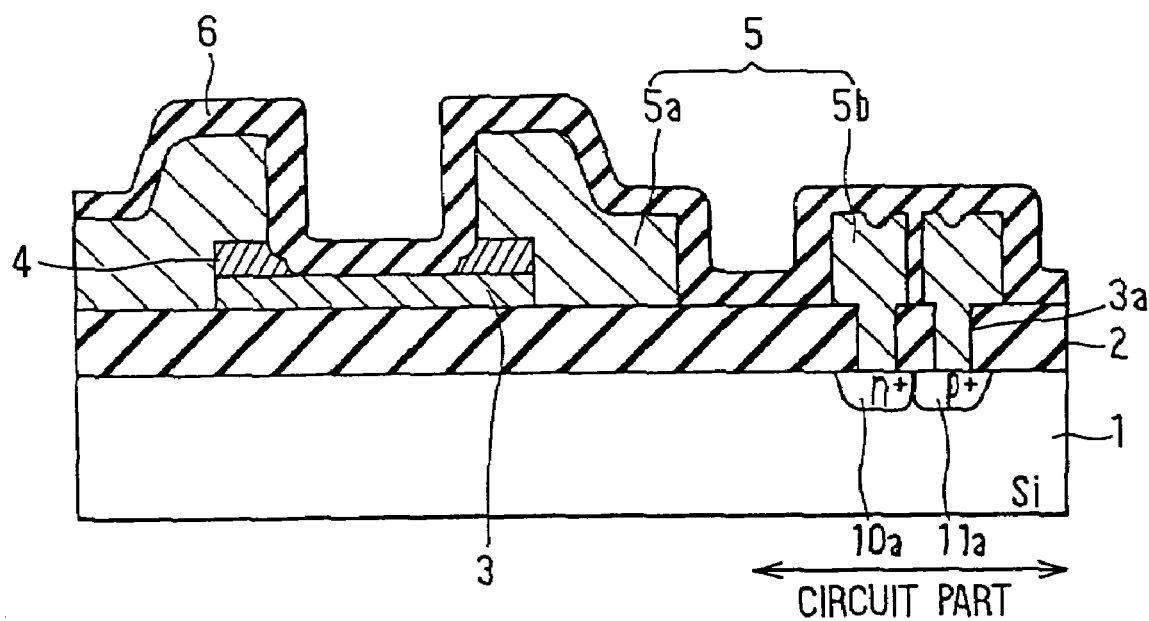
FIG. 4 is a cross-sectional view showing a semiconductor device manufactured by a method according to a first preferred embodiment of the present invention.

First, a structure of a semiconductor device including a metallic thin film resistor which is manufactured by a method in a first preferred embodiment will be explained referring to FIG. 4. The semiconductor device has a circuit part including a PN junction element such as diode or transistor, and the metallic thin film resistor 3 made of CrSi or CrSiN is formed on a semiconductor substrate 1 including the circuit part.

Specifically, an $n^+$ type diffusion layer 10a and a $p^+$ type diffusion layer 11a are provided in a surface region of the silicon semiconductor substrate 1 at a circuit part side, thereby forming a PN junction between the $n^+$ type diffusion layer 10a and the $p^+$ type diffusion layer 11a, which constitutes the PN junction element. An insulation film 2 such as a BPSG film including boron (B) and phosphorus (P) is deposited on the semiconductor substrate 1, and the metallic thin film resistor 3 is formed on the insulation film 2. Al electrodes 5a are provided on both end portions of the metallic thin film resistor 3 through a barrier metal 4 made of TiW or the like. The insulation film 2 has contact holes 3a therein on the upper portion of the PN junction. Al wiring segments 5b are electrically connected to the PN junction element through the contact holes 3a. The metallic thin film resistor 3, the barrier metal 4, the Al electrodes 5a, and the Al wiring segments 5b are entirely covered with a protective film (intermediate insulation film) 6 such as a TEOS oxide film. Thus, the semiconductor device is constituted.

Next, a method of manufacturing the semiconductor device shown in FIG. 4 will be explained referring to FIGS. 5A to 5F.

Figure 5A:
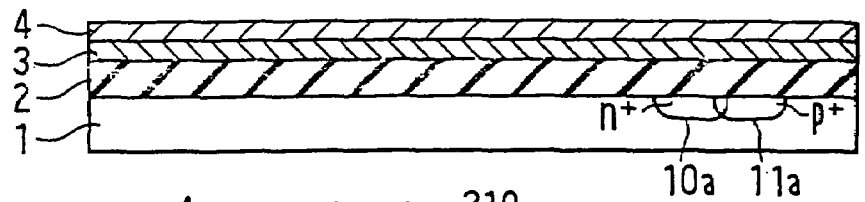
FIGS. 5A to 5F are cross-sectional views for explaining the method in the first embodiment in a stepwise manner.

At a step shown in FIG. 5A, first, the insulation film 2 is formed on the silicon semiconductor substrate 1 by plasma enhanced CVD, atmospheric pressure CVD, thermal oxidation, or the like. The PN junction element composed of the $N^+$ type diffusion layer 10a and the $p^+$ type diffusion layer 11a are formed in the semiconductor substrate 1 before forming the insulation film 2. Next, the metallic thin film resistor 3 made of CrSi or CrSiN is formed on the insulation film 2 by a sputtering method to have a thickness of approximately 200 Å. The barrier metal 4 is then formed from TiW with a thickness of approximately 2000 Å.

Figure 5B:
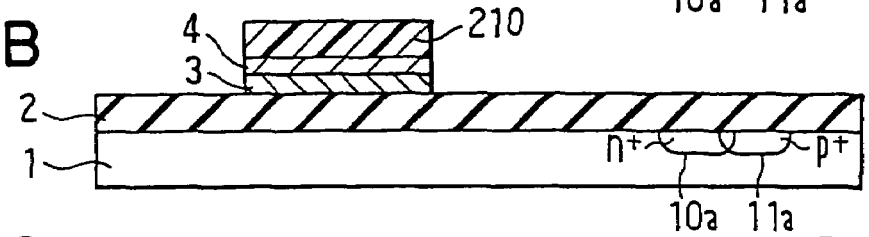
Figure 5C:
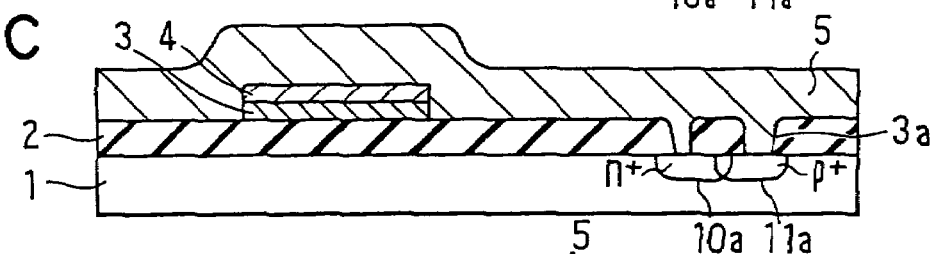

At a step shown in FIG. 5B, the metallic thin film resistor 3 and the barrier metal 4 are patterned by dry etching using gas such as $CF_4$, and a photo-resist 210 serving as a mask. At a step shown in FIG. 5C, the contact holes 3a are formed in the insulation film 2 through a photo-lithography step for the electrical connection with the PN junction at the circuit part. Successively, an Al film 5 made of Al or AlSi are entirely formed with a thickness of approximately 1.0 μm.

Figure 5D:
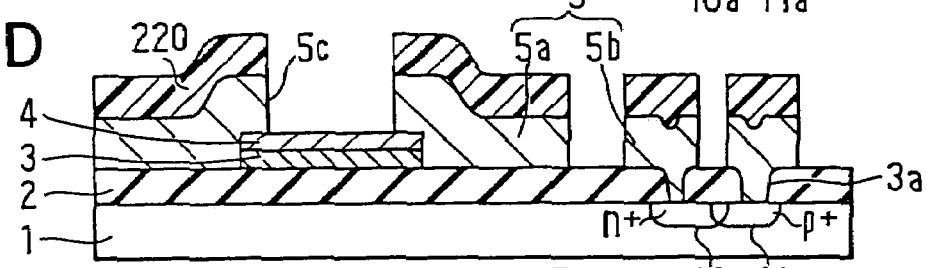

At a step shown in FIG. 5D, dry etching is carried out using $CCl_4$ or the like as etching gas and a photo-resist 220 as an etching mask to pattern the Al film 5, thereby forming the Al electrodes 5a for the metallic thin film resistor 3 and the Al wiring segments 5b for the circuit part. Simultaneously, the Al film 5 disposed above the metallic thin film resistor 3 is removed to form an opening portion 5c in the Al film 5.

Figure 5E:
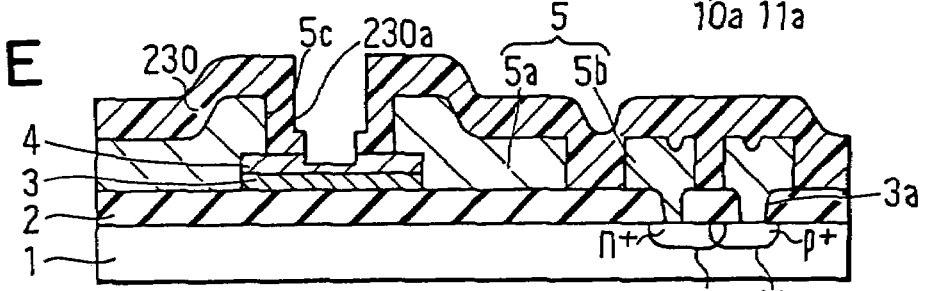

At a step shown in FIG. 5E, first, a photo-resist 230 is formed with an opening portion 230a therein exposing the barrier metal 4. At that time, a length between an opening end of the opening portion 230a defined in the photo-resist 230 and an opening end of the opening portion 5c defined in the Al film 5, i.e., the thickness of the photo-resist 230 formed on the inner wall of in the opening portion 5c is controlled to be approximately 2 μm. Then, the barrier metal 4 is removed through the photo-resist 230 serving as a mask. In this case, because the photo-resist 230 is formed inside the opening portion 5c of the Al film 5, the barrier metal 4 is removed from an inner side more than the opening end of the Al film 5. Therefore, the barrier metal 4 underlying the Al film 5 is hardly removed even by wet etching.

Thus, because the photo-lithography step is carried out twice, the barrier metal 4 underlying the Al film 5, i.e., the barrier metal 4 inside the opening end of the opening portion 5c is not under-cut. Therefore, it is not necessary to form the protective film 6 under the Al film 5 at the successive step. As a result, the step-coverage of the protective film 6 is improved, resulting in high reliability of the semiconductor device.

Figure 6:
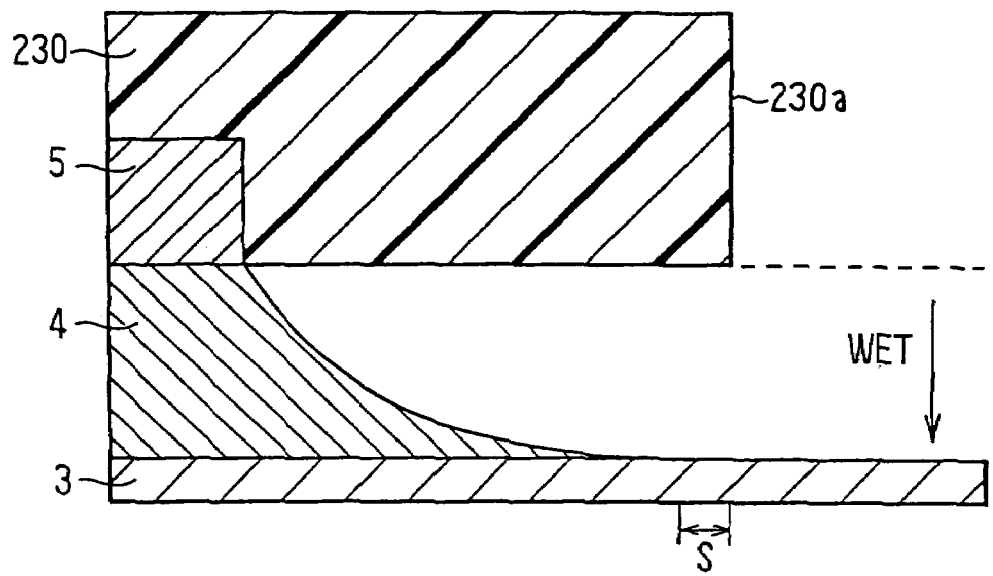
FIG. 6 is a partially enlarged cross-sectional view showing a part around a barrier metal when only wet etching is performed.

In view of this point, it is conceivable that the barrier metal 4 is removed only by wet etching. When the barrier metal 4 is removed only by the wet etching, however, referring to FIG. 6, it is difficult to control a side etching amount S. Variation in the side etching amount S causes variation in a contact length between the barrier metal 4 and the metallic thin film resistor 3, i.e., causes variation in a substantial resistor length of the metallic thin film resistor 3.

Therefore, at the step shown in FIG. 5E, first, the barrier metal 4 is dry-etched through the opening portion 23c of the photo-resist 230 with $CF_4$ or the like so that it is thinned by a thickness of approximately 1000 Å. Accordingly, the thickness of the barrier metal 4 becomes approximately 1000 Å. Because the barrier metal 4 is dry-etched, the side etching amount produced at this step is small.

Figure 5F:
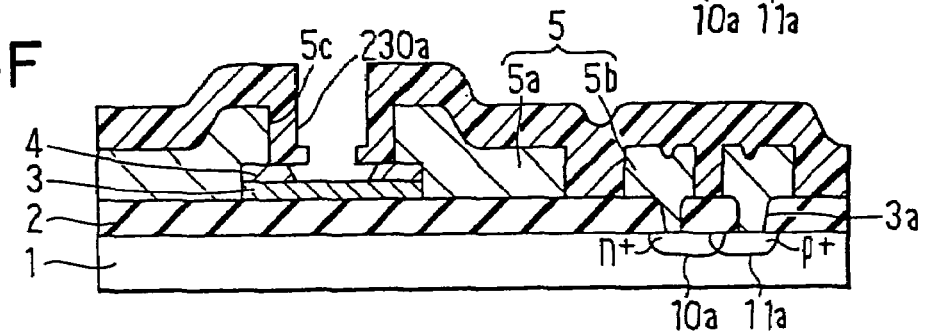
Figure 7:
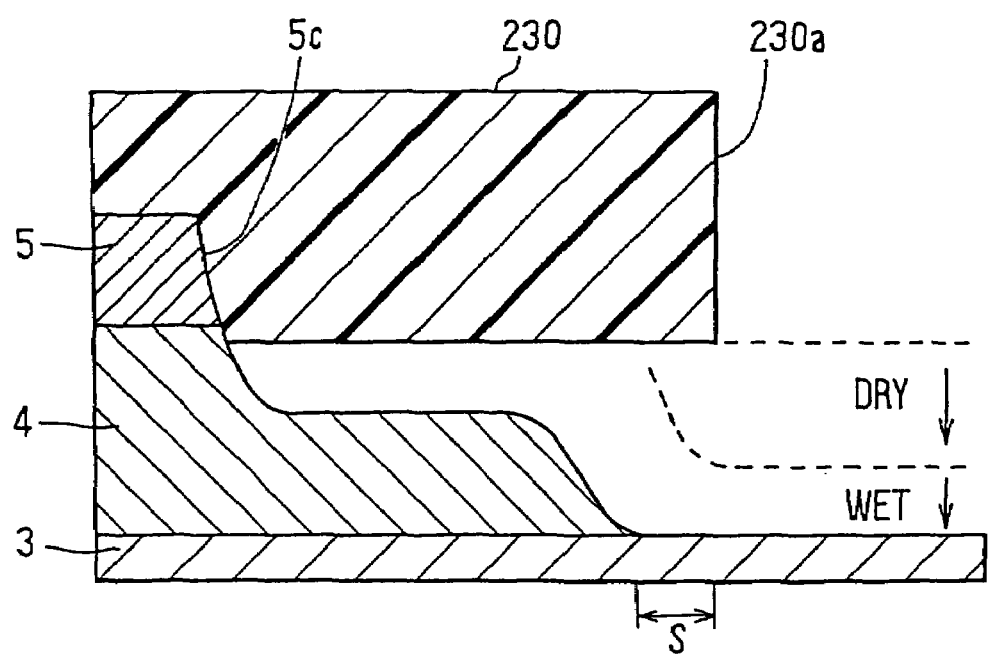
FIG. 7 is a partially enlarged cross-sectional view showing a part around the barrier metal when dry etching and wet etching are successively performed in the first embodiment.

Next, at a step shown in FIG. 5F, wet etching is carried out using the photo-resist 230 as a mask again, and using etching solution mainly including $H_2O_2$. As a result, the remaining barrier metal 4 is removed so that the metallic thin film resistor 3 is exposed. FIG. 7 schematically shows a portion around the barrier metal 4 at this stage.

As described above, when the barrier metal 4 is removed only by wet etching, the barrier metal 4 is removed in a lateral direction by side etching. On the other hand, according to the present embodiment, because the barrier metal 4 is removed by successively carried out the dry etching and the wet etching, the barrier metal 4 has a step shape as a result of performing the two etching steps. At that time, because the dry etching is carried out first, the wet etching capable of easily increasing the side etching amount is required to remove only the remaining portion. Therefore, the total side etching amount is decreased as compared to the case where the barrier metal is removed only by the wet etching. The side etching amount of the barrier metal 4 can be accurately controlled, and accordingly, the variation in the contact length between the barrier metal 4 and the metallic thin film resistor 3 can be decreased. As a result, the substantial resistor length of the metallic thin film resistor 3 is obtained with high controllability.

Incidentally, only for decreasing the variation in the contact length between the barrier metal 4 and the metallic thin film resistor 3, it is conceivable that the removal of the barrier metal 4 is done only by the dry etching without performing the wet etching. However, it is not preferable because the etching gas such as $CF_4$ used in the dry etching damages the thin film resistor 3 to extremely increase the sheet resistance of the thin film resistor 3. Because of this, the part of the barrier metal 4 directly contacting the upper surface of the metallic thin film resistor 3 should be removed by the wet etching. Finally, after the protective film 6 is formed, a heat treatment is carried out under nitrogen atmosphere at 450° C. for 20 min., thereby forming the semiconductor device including the thin film resistor 3.

In addition to the effects described above, according to the first embodiment, as shown in FIG. 5E, the photo-resist 230 is disposed with a specific thickness on the inner wall of the opening portion 5a of the Al film 5 to form the opening portion 230a having a diameter smaller than that of the opening portion 5a. Then, the barrier metal 4 is etched from the inner side more than the opening portion 5c of the Al film 5. Therefore, the barrier metal 4 underlying the Al film 5 is not largely under-etched.

Further, because the Al film 5 is covered with the photo-resist 230 during the wet etching, the Al film 5 and the barrier metal 4 are not exposed to the etching solution at the same time. Accordingly, undesirable etching of the Al film 5 (elution of Al), which is caused by a battery effect, does not occur. Incidentally, the battery effect occurs when the Al film 5 and the barrier metal 4, which have ionization tendencies different from each other, are exposed to the etching solution at the same time as in the conventional manner in which the Al film is not covered during the wet etching.

In the first embodiment, the thickness of the barrier metal 4 is controlled to be approximately 2000 Å; however, it is not limited to that and may be changed if necessary. A preferable minimum thickness of the barrier metal 4 for preventing mutual diffusion between the Al film 5 and the metallic thin film resistor 3 is approximately 500 Å.

The etching amount of the barrier metal 4 by the dry etching is controlled to be approximately 1000 Å when the initial thickness of the barrier metal 4 is approximately 2000 Å. The etching amount is determined to prevent the effect of the dry etching from eliminating by the wet etching. When the etching amount by the dry etching is too small, the adverse effect by the wet etching prominently appears, and the wet etching cannot follow the shape formed by the dry etching. As a result, the effects described above do not effectively appear. For instance, the side etching amount S cannot be accurately controlled.

Figure 8:
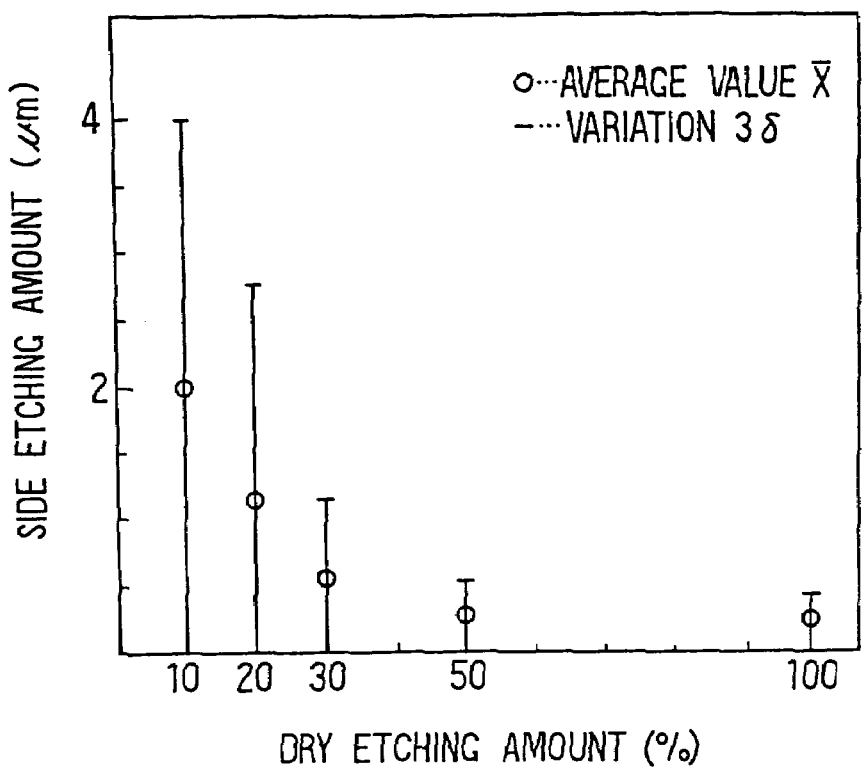
FIG. 8 is a graph showing a relationship between a dry etching amount and a side etching amount in the first embodiment.

FIG. 8 is an experimental result indicating the side etching amounts with respect to the dry etching amount. Specifically, the dry etching amount represents the dry etching amount relative to the sum of the dry etching amount and the wet etching amount, i.e., relative to the total etching amount. According to the figure, it is found that, for instance, when the variation in the side etching amount is aimed to be equal to or less than 2 μm, the dry etching amount should be approximately 20% or more of the barrier metal 4 in thickness. The etching amount described above was fixed in this way.

The larger the dry etching amount becomes, the smaller the adverse effect by the wet etching becomes. However, as described above, the dry etching can increase the sheet resistance of the metallic thin film resistor 3. Therefore, it is preferable that the barrier metal 4 is left with a thickness equal to or more than 100 Å by the dry etching in consideration of the variation in the etching amount and the like.

Further, according to the first embodiment described above, both the dry etching and the wet etching are carried out through the opening portion 230a of the photo-resist 230 having an inner diameter smaller than that of the opening portion 5a of the Al film 5. However, it is sufficient that only the wet etching is carried out through the small opening portion 230a of the photo-resist 230, and the dry etching can be carried out through the opening portion 5c of the Al film 5. In this case, after the dry etching is carried out, the photo-resist 230 having the opening portion 230a is formed to serve as the mask for the wet etching as a finish etching. Also, although the Al electrodes 5a and the Al wiring segments 5b are formed from the Al film 5 in the first embodiment, they may be formed from separate Al films.

Second Embodiment

Al over-hanging is considered to be produced by a battery effect between an Al film and a TiW film, and TiW under-cut is considered to be produced by a battery effect between the TiW film and a CrSi resistor and by wet-etching in a lateral direction. Further, when the amount of the TiW under-cut becomes large to expose an interface between the Al film and the TiW film, the generation of the Al over-hanging is accelerated. In a second preferred embodiment, the Al over-hanging and the TiW under-cut are prevented based on the considerations described above without performing two etching steps as in the first embodiment.

Figure 9:
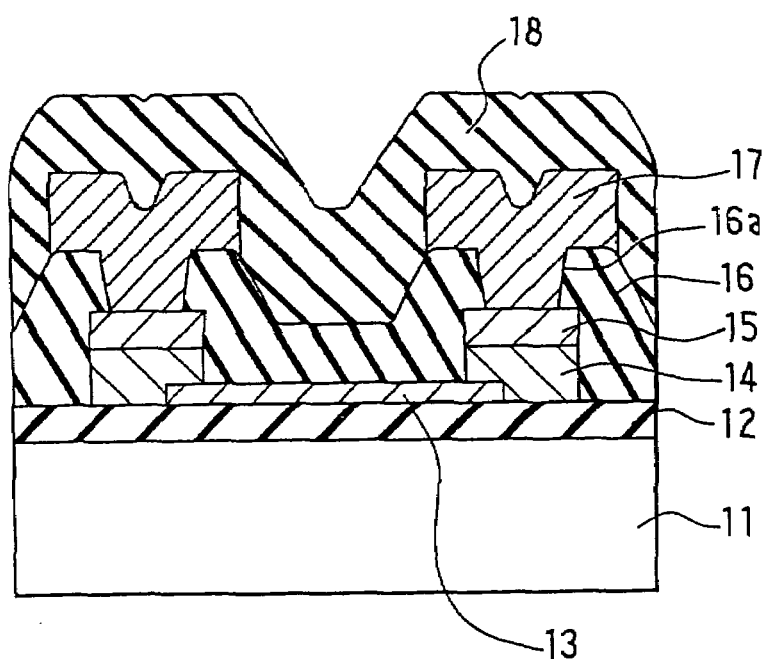
FIG. 9 is a cross-sectional view showing a CrSi resistor device manufacture by a method according to a second preferred embodiment.

First, a constitution of a semiconductor device in the second embodiment will be explained referring to FIG. 9. As shown in FIG. 9, a CrSi resistor 13 as a thin film resistive member is formed on a silicon substrate 11, in which a semiconductor element not shown in provided, through a silicon oxide film 12. An Al film 15 is disposed as electrodes on both ends of the CrSi resistor 13 through a TiW film 14 as a barrier metal.

The edge portions of the TiW film 14 and the Al film 15 are not inversely tapered as a whole, and are approximately perpendicular to the surface of the CrSi resistor 13. An intermediate insulation film 16 is disposed on the entire surface of the silicon substrate 11 to cover the CrSi resistor 13. Via holes 16a are formed in the intermediate insulation film 16, and an Al wiring layer 17 is electrically connected to the Al film 15 through the via holes 16a. A protective film 18 is further disposed on the entire surface of the silicon substrate 11 to cover the Al wiring layer 17 and the like. The shapes of the Al wiring layer 17 and the protective film 18 follow the shapes of the TiW film 14 and the Al film 15. Therefore, these films are not inversely tapered as well. Thus, a CrSi resistor device is constituted.

Next, a method of manufacturing the semiconductor device shown in FIG. 9 will be described referring to FIGS. 10A to 10D.

Figure 10A:
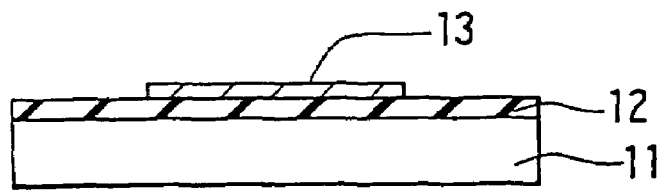
FIGS. 10A to 10D are cross-sectional views for explaining the method of manufacturing the CrSi resistor device in the second embodiment in a stepwise manner.
Figure 10B:
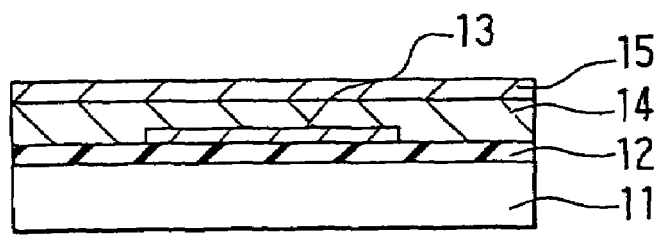

First, at a step shown in FIG. 10A, after the semiconductor element is formed in the silicon substrate 11, the silicon oxide film 12 is formed on the silicon substrate 11. A CrSi film as thin film resistor material is formed on the silicon oxide film 12 with a thickness in a range of approximately 10 nm to 20 nm, and is patterned to form the CrSi resistor 13. At a step shown in FIG. 10B, the TiW film 14 as barrier metal material is deposited to cover the CrSi resistor 13. Further, the Al film 15 as electrode material is deposited on the TiW film 14. The thickness of the Al film 15 is equal to or less than 300 nm. The reason of determining this thickness will be explained later.

Figure 10C:
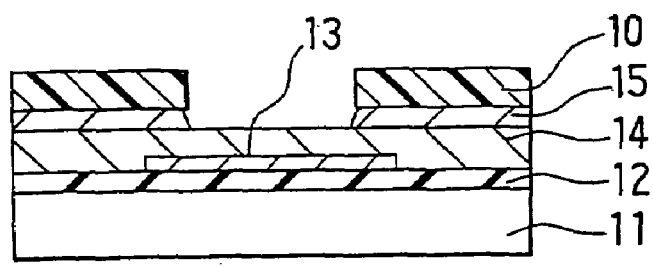

Next, at a step shown in FIG. 10C, a photo-resist 10 is deposited on the Al film 15, and is partially removed to remain on a specific portion. Then, the Al film 15 is patterned using the photo-resist 10 as a mask. At that time, a ratio of the upper surface area of the patterned Al film 15 relative to the upper surface area of the CrSi resistor 13 is controlled to be equal to or larger than 0.02 and not to exceed 2.0.

Figure 10D:
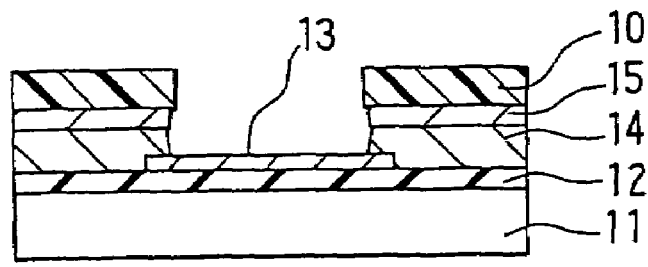

Then, at a step shown in FIG. 10D, the TiW film 14 is patterned by wet etching using the photo-resist 10 as a mask. The wet etching uses etching solution of $NH_4OH:H_2O_2:H_2O=5:100:400$ as a composition ratio. Ionization tendency of metal changes according to kinds of solution. In the solution described above, ionization tendencies satisfy a relationship of Al>TiW>CrSi. Therefore, the etching of the TiW film 14 using the above etching solution progresses in a state where the ionization tendency of Al is larger than that of TiW.

Next, the reason why the ratio in area of the Al film 5 relative to the CrSi resistor 13 is set equal to or larger than 0.02 as described above will be explained in connection with the etching property.

Generally, an etching (corrosion) amount by a battery effect occurring when two metals are exposed to etching solution is decreased when a metal having ionization tendency larger than that of the other metal has an exposed area (solution contact area) larger than that of the other metal. Because of this, the under-cut of the TiW film 14 produced by the battery effect between the TiW film 14 and the CrSi resistor 13 can be decreased by setting the ratio of the solution contact area of the TiW film 14 relative to that of the CrSi resistor 13 large.

Figure 11A:
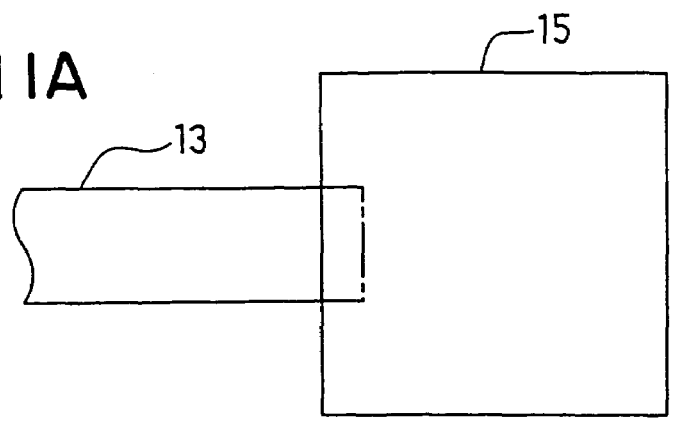
FIGS. 11A and 11B are plan and cross-sectional views, respectively, for explaining a relationship in area between a CrSi resistor and an Al film in the second embodiment.
Figure 11B:
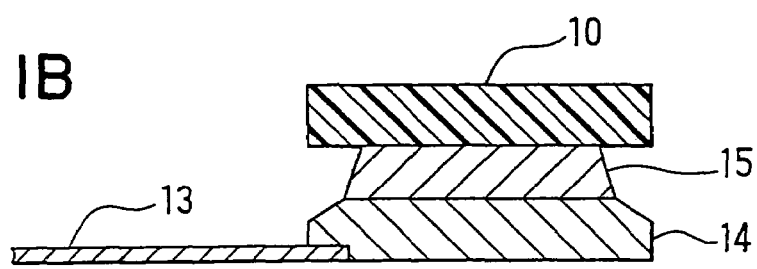

Referring to FIGS. 11A and 11B, the solution contact areas of the CrSi resistor 13 and the TiW film 14 in the present embodiment are considered in more detail. The solution contact area of the CrSi resistor 13 approximately corresponds to the upper surface area of the CrSi resistor 13 because the thickness of the CrSi resistor 13 is in a range of 10 nm to 20 nm, which is very thin.

On the other hand, the solution contact area of the TiW film 14 corresponds to a circumferential area thereof because the upper surface of the TiW film 14 is covered with the Al film 15. Therefore, the solution contact area of the TiW film 14 can be represented by the product of the circumferential length and the thickness of the TiW film 14, which correlates with the upper surface area of the TiW film 14. Further, the upper surface area of the TiW film 14 is approximately equal to the upper surface area of the Al film 15 that serves as a mask when the TiW film 14 is patterned. Therefore, there is a relationship that the circumferential area of the TiW film 14 $\propto$ the upper surface area of the TiW film 14 $\approx$ the upper surface area of the Al film 15. Accordingly, the under-cut amount by the battery effect can be estimated based on the ratio of the upper surface area of the Al film 15 relative to the upper surface area of the CrSi resistor 13.

Figure 12:
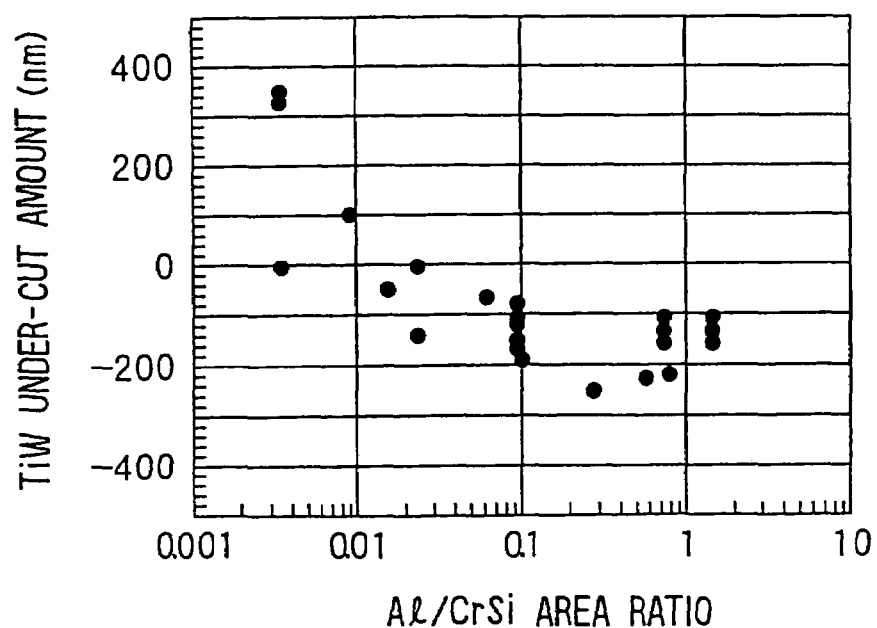
FIG. 12 is a graph showing a change in a TiW under-cut amount relative to a ratio of an upper surface area the Al film relative to an upper surface area of the CrSi resistor in the second embodiment.

FIG. 12 shows a change in under-cut amount of the TiW film 14 when the ratio of the upper surface area of the Al film 15 relative to the upper surface area of the CrSi resistor 13 is changed. In the figure, the case in which the under-cut amount is larger than zero means that the TiW film 14 is under-cut inwardly from the Al film 15. The case in which the under-cut amount is smaller than zero means that the TiW film 14 protrudes outwardly from the Al film 15 without being under-cut.

As shown in FIG. 12, when the ratio of the upper surface area of the Al film 15 relative to that of the CrSi resistor 13 (Al/CrSi area ratio) is equal to or larger than 0.02, the under-cut amount of the TiW film 14 becomes equal to or less than zero. That is, in this case, the under-cut of the TiW film 14 is not produced by the battery effect occurring between the CrSi resistor 13 and the TiW film 14.

Figure 13:
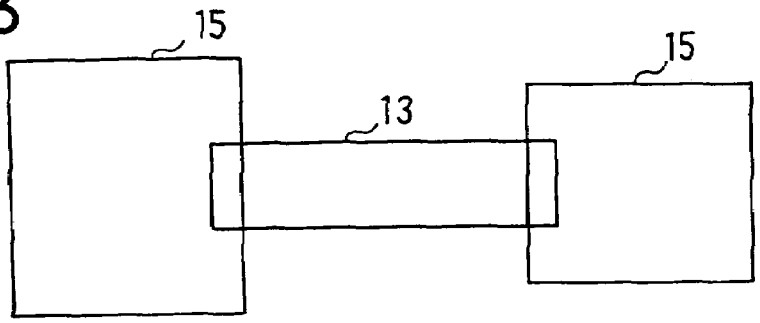
FIG. 13 is a schematic plan view for explaining a case where segments of the Al film disposed on both ends of the CrSi resistor have areas different from each other.

The increase in the under-cut amount of the TiW film 14 means an increase in an exposed area of the interface between the TiW film 14 and the Al film 15, resulting in an increase in over-etching of the Al film 15 that is produced by the battery effect between the TiW film 14 and the Al film 15. To the contrary, the prevention of the under-cut of the TiW film 14 prevents the exposure of the interface between the TiW film 14 and the Al film 15, resulting in prevention of over-hanging of the Al film 15. As shown in FIG. 13, when the Al film 15 includes two Al segments disposed on both ends of the CrSi resistor 13 and having upper surface areas different from each other, each of the upper surface areas of the Al segments is set to fall within the range described above relative to the upper surface area of the CrSi resistor 13.

Figure 1A:
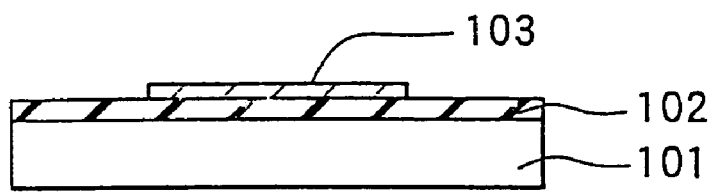
FIGS. 1A to 1D are cross-sectional views for explaining a conventional method of manufacturing a semiconductor device in a stepwise manner.
Figure 1B:
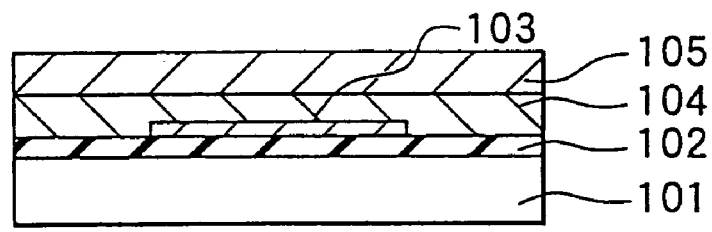
Figure 1C:
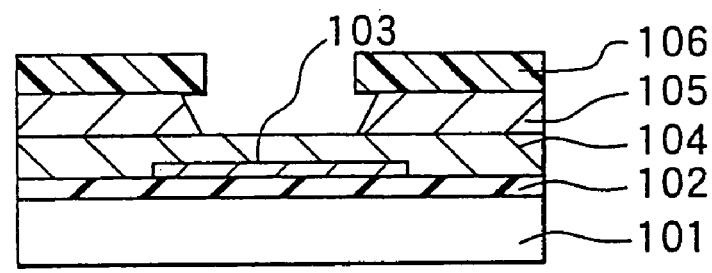
Figure 1D:
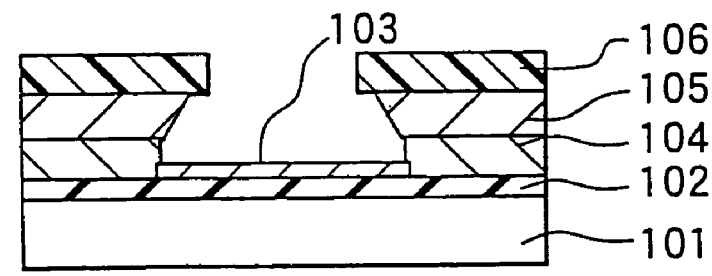
Figure 2:
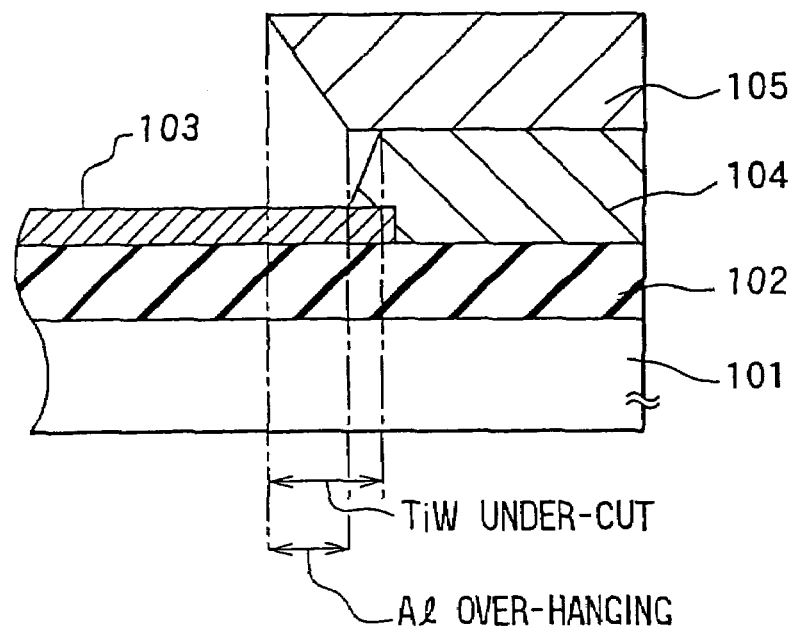
FIG. 2 is a schematic view for explaining problems caused by the conventional method.
Figure 3:
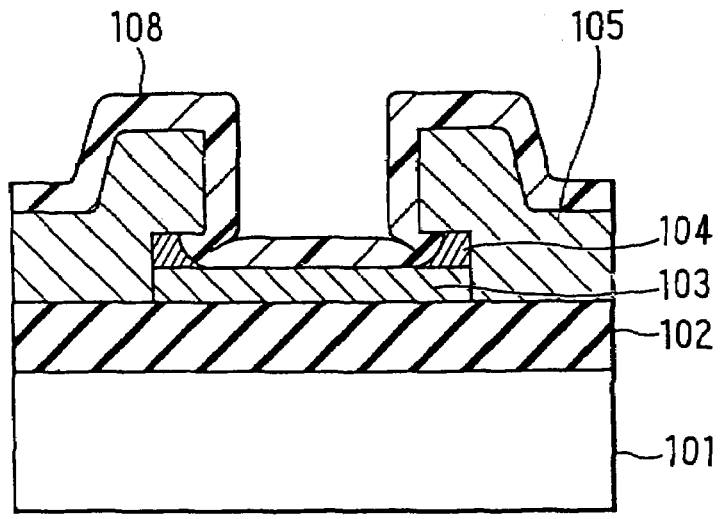
FIG. 3 is a schematic view for explaining another problem caused by the conventional method.

Next, the reason why the thickness of the Al film 15 is set equal to or less than 300 nm will be explained. As described above, the over-hanging of the Al film 15 occurs due to elution of Al caused by the battery effect between the Al film 15 and the TiW film 14. In the conventional CrSi resistor device shown in FIG. 2, the etching amount of the Al film 105 is large around the interface between the Al film 105 and the TiW film 104, and is small around the surface of the Al film 105. It is assumed that this difference in the etching amount of the Al film 105 produces the over-hanging of the Al film 105. The etching amount of the Al film 105 changes according to the distance from the interface between the Al film 105 and the TiW film 104. That is, it is considered that the larger the thickness of the Al film 105 becomes, the larger the over-hanging becomes.

Figure 14:
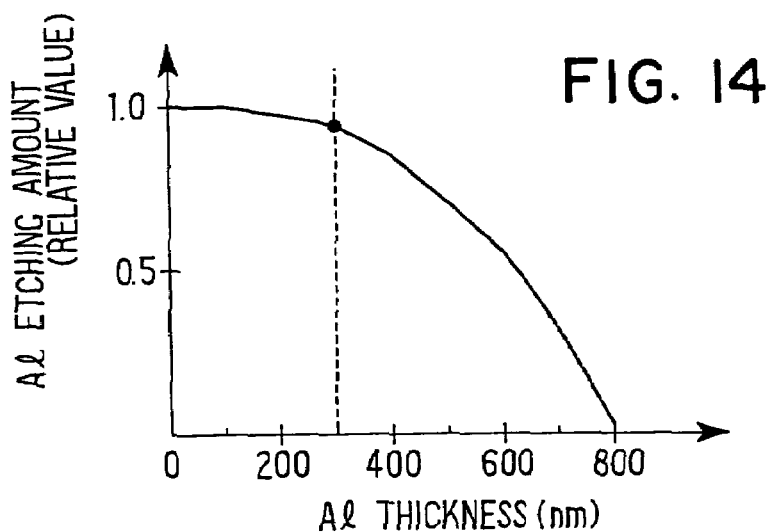
FIG. 14 is a graph showing a relationship between a thickness of the Al film and an etching amount of the Al film.

In view of this point, the over-hanging amount was examined while changing the thickness of the Al film 15 in the present embodiment. The result is shown in FIG. 14. Accordingly, it is found that the etching amount of the Al film 15 relates to the thickness of the Al film 15, and has variation with an inclination which changes at a thickness of approximately 300 nm as an inflection point. Therefore, the thickness of the Al film 15 is set equal to or less than 300 nm in the present embodiment so that the etching amount difference in the Al film 15 is decreased, thereby reducing the over-hanging amount of the Al film 15.

Figure 15:
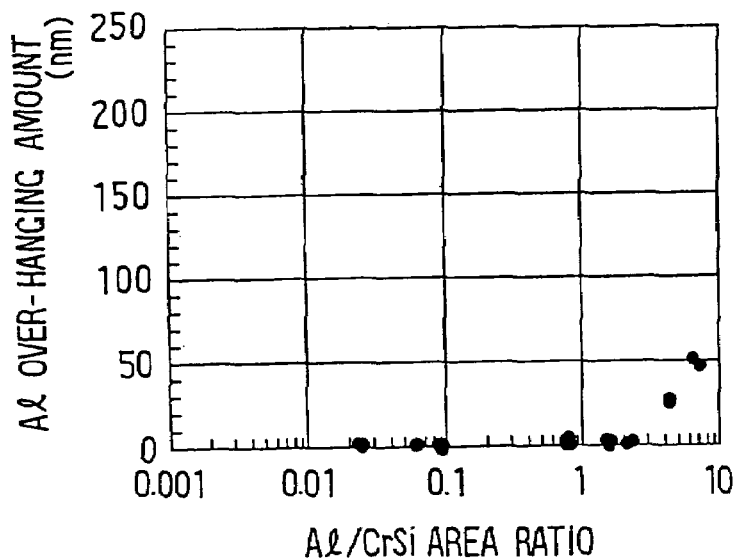
FIG. 15 is a graph showing a change in an over-hanging amount of the Al film relative to a ratio between the upper surface area of the CrSi resistor and the upper surface area of the Al film.

Further, a change in the over-hanging amount of the Al film 15 was examined with respect to the ratio of the upper surface area of the Al film 15 relative to the upper surface area of the CrSi resistor 13. The result is shown in FIG. 15. It is found that the over-hanging amount become large when the ratio of the upper surface area of the Al film 15 relative to the upper surface area of the CrSi resistor 13 exceeds 2.0. Based on this result, the ratio of the upper surface area of the Al film 15 relative to the upper surface area of the CrSi resistor 13 is suppressed not to exceed 2.0 in the present embodiment.

Accordingly, the present embodiment can reduce not only the under-cut of the TiW film 14 produced by the battery effect between the CrSi resistor 13 and the TiW film 5 but also the over-hanging of the Al film 15 produced by the battery effect between the Al film 15 and the TiW film 14 when the TiW film 14 is patterned. As a result, the TiW film 14 and the Al film 15 are not inversely tapered in cross-section, thereby preventing the breakage of the wiring layer 17 formed above the CrSi resistor 13 and cracks in the protective film 18.

Incidentally, because the over-hanging amount of the Al film 15 is suppressed, the upper surface area of the TiW film 14 can be roughly calculated with the upper surface area of the Al film 15 to prevent the under-cut of the TiW film 14. Further, the photo-resist 10 remaining when the TiW film 14 is patterned reduces the solution contact area of the Al film 15. This makes the etching of the Al film 15 by the battery effect between the Al film 15 and the TiW film 14 easier than that of the TiW film 14, and therefore, contributes to the prevention of the under-etching of the TiW film 14.

Then, after the step shown in FIG. 10D, the intermediate insulation film 16 is disposed on the entire upper surface of the silicon substrate 11 to cover the Al film 15 and the CrSi resistor 13. Then, the via holes 16a are formed in the intermediate insulation film 16, and the Al wiring layer 17 and the protective film 18 are successively formed. As a result, the CrSi resistor device shown in FIG. 9 is completed. According to the second embodiment described above, the over-hanging of the Al film 15 and the under-cut of the TiW film 14 can be prevented without increasing a number of manufacturing process as compared to the conventional method.

In the second embodiment, after the CrSi resistor 13 is patterned, the TiW film 14 as barrier metal and the Al film 15 as electrode material are deposited to cover the CrSi resistor 13; however, the manufacturing process shown in FIGS. 16A to 16E are adoptable as well.

Figure 16A:
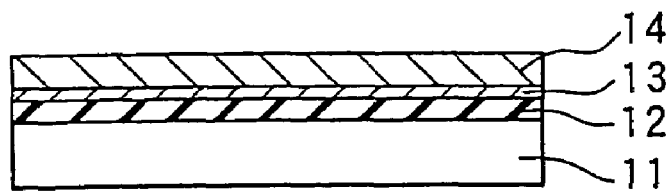
FIGS. 16A to 16E are cross-sectional views showing a process of manufacturing the CrSi resistor device in a stepwise manner according to a modified embodiment of the second embodiment.
Figure 16B:
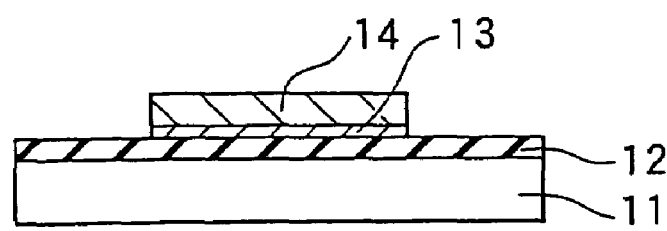
Figure 16C:
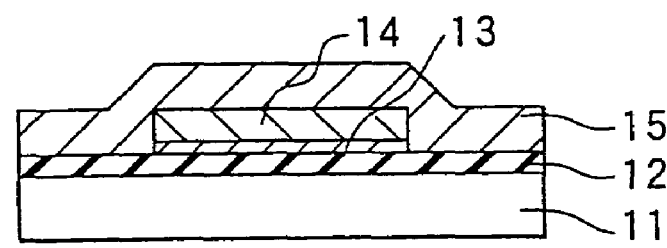
Figure 16D:
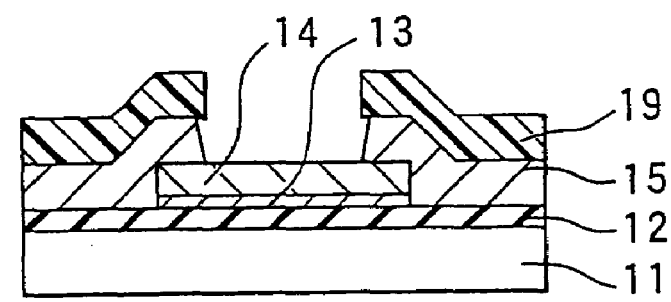
Figure 16E:
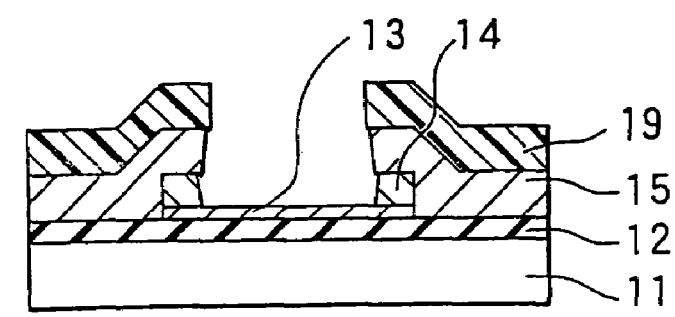

Specifically, after the CrSi film 3 for the CrSi resistor and the TiW film 14 are deposited on the silicon substrate 11 through the silicon oxide film 12 as shown in FIG. 16A, the CrSi film 3 and the TiW film 14 are simultaneously patterned using an identical mask as shown in FIG. 16B. Next, as shown in FIG. 16C, after the Al film 15 is deposited to cover the CrSi resistor 13 and the TiW film 14, as shown in FIG. 16D, the Al film 15 is patterned using a photo-resist 19 as a mask. After that, as shown in FIG. 16E, the TiW film 14 is etched. Thus, the Al film 15 can be deposited after the CrSi resistor 13 and the TiW film 14 are patterned. The other features are the same as those in the second embodiment. Accordingly, the same effects as those in the second embodiment can be provided.

In addition, according to the procedure shown in FIGS. 16A to 16E, because the Al film 15 is disposed directly on the silicon oxide film 12, the Al film 15 can be utilized as an element for another device, or a wiring member for connecting the CrSi resistor 13 with another device. When the CrSi resistor device is manufactured in the procedure described above, however, it is confirmed that the over-hanging of the Al film 15 is liable to become large as compared to the case where it is manufactured in the procedure shown in FIGS. 10A to 10D.

The reason is considered as follows. That is, the Al film 15 directly formed on the silicon oxide film 12 can contact the silicon substrate 11 through contact holes or the like provided in the silicon oxide film 12. Accordingly, when the etching occurs due to the battery effect between the Al film 15 and the TiW film 14, electrons remaining in the Al film 15 flows into the silicon substrate 11 to further accelerate the etching of the Al film 15.

Figure 17:
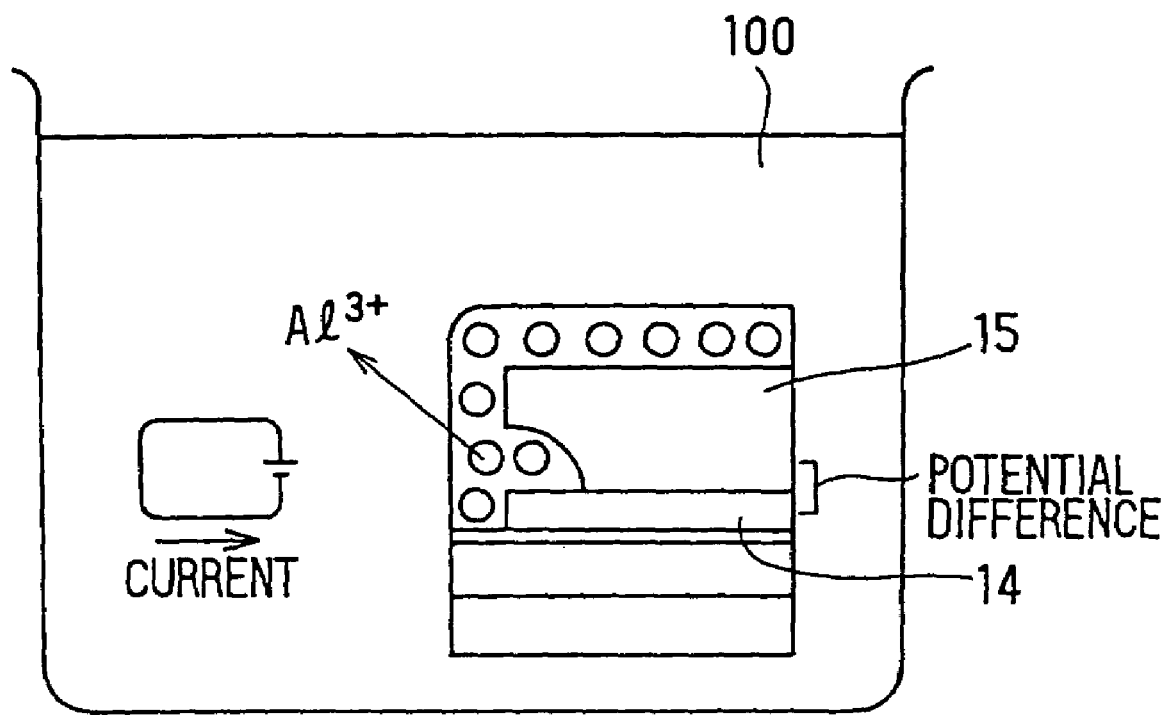
FIG. 17 is a schematic view for explaining a mechanism of over-hanging of the Al film.

This phenomenon will be specifically explained in connection with the over-hanging mechanism of the Al film 15 referring to FIG. 17 in which it is assumed that the semiconductor device is immersed into alkaline aqueous solution 100 having high conductivity for wet-etching the TiW film 14. In such a case, an electromotive force is produced between the TiW film 14 and the Al film 15 to provide a battery effect therebetween. Al is a base metal as compared to TiW, and accordingly is dissolved by the battery effect. This results in the over-hanging of the Al film 15.

When the Al film 15 is dissolved, the following chemical reactions (1) to (3) occur;

$$Al \rightarrow Al^{3+} + 3e^- \quad (1)$$

$$3/2H_2O + 3/4O_2 + 3e^- \rightarrow 3OH^- \quad (2)$$

$$Al^{3+} + 3OH^- \rightarrow Al(OH)_3 \quad (3)$$

in which reaction (1) occurs at the base metal (Al) side, reaction (2) occurs at the noble metal (TiW) side, and reaction (3) occurs in the solution.

When the Al film 15 contacts the silicon substrate 11 or other conductive members, electrons produced by reaction (1) flows into the silicon substrate 11 or the like to promote reaction (1). As a result, the etching of the Al film 15 is accelerated. To prevent this problem, the Al film 15 should be prevented from contacting the silicon substrate 11 and the other wiring members when the TiW film 14 is patterned.

Third Embodiment

In a third preferred embodiment, referring again to FIG. 17, the potential difference produced between the Al film and the TiW film is lowered to prevent Al from being dissolved. First, a constitution of a MOSFET in the third embodiment will be explained referring to FIG. 18.

Figure 18:
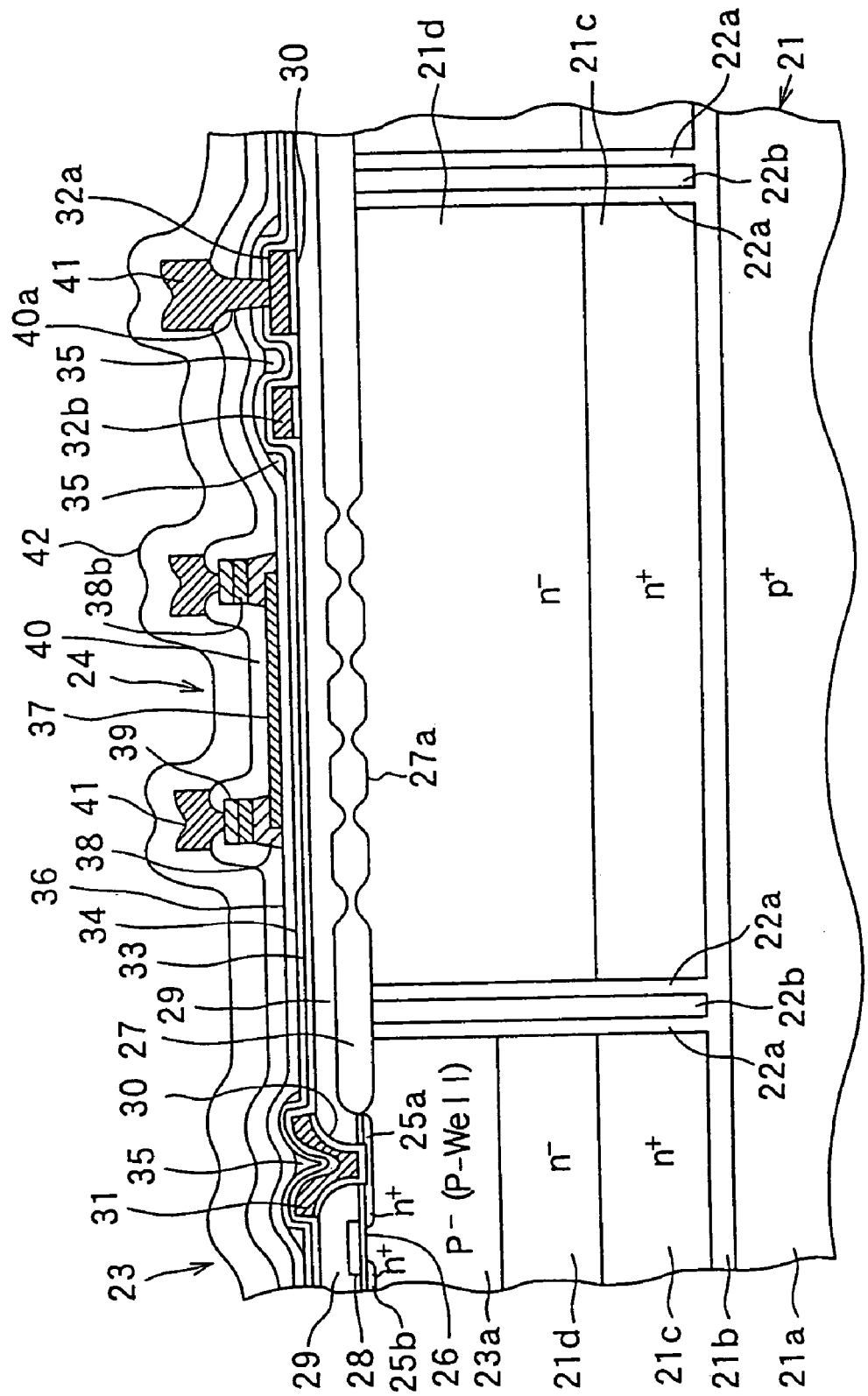
FIG. 18 is a cross-sectional view partially showing a circuit part including a MOSFET part and a CrSi resistor part in a third preferred embodiment.
Figure 19:
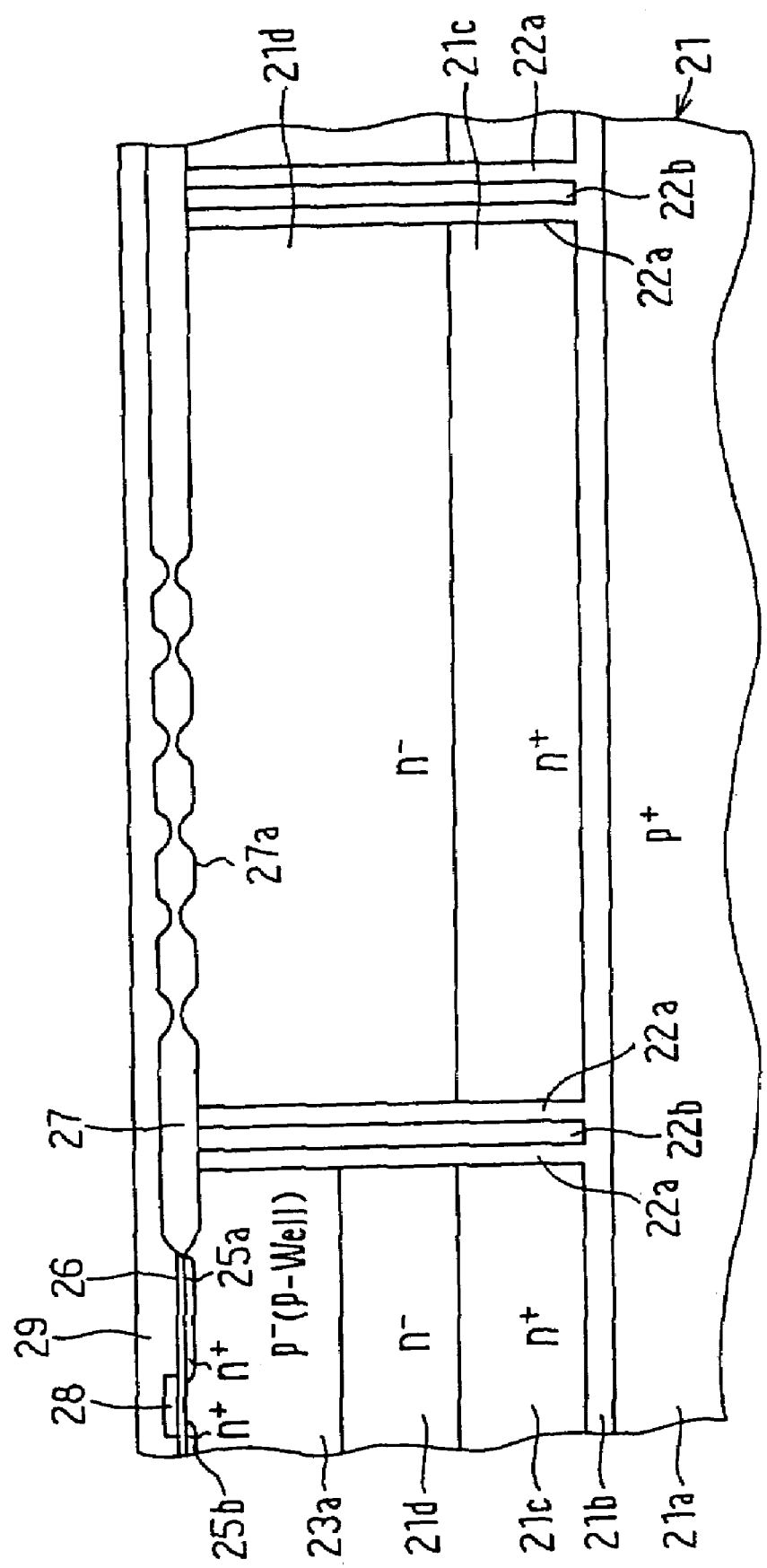
FIGS. 19 to 29 are cross-sectional views showing a method of manufacturing the integrated circuit shown in FIG. 18 in a stepwise manner in the third embodiment.
Figure 20:
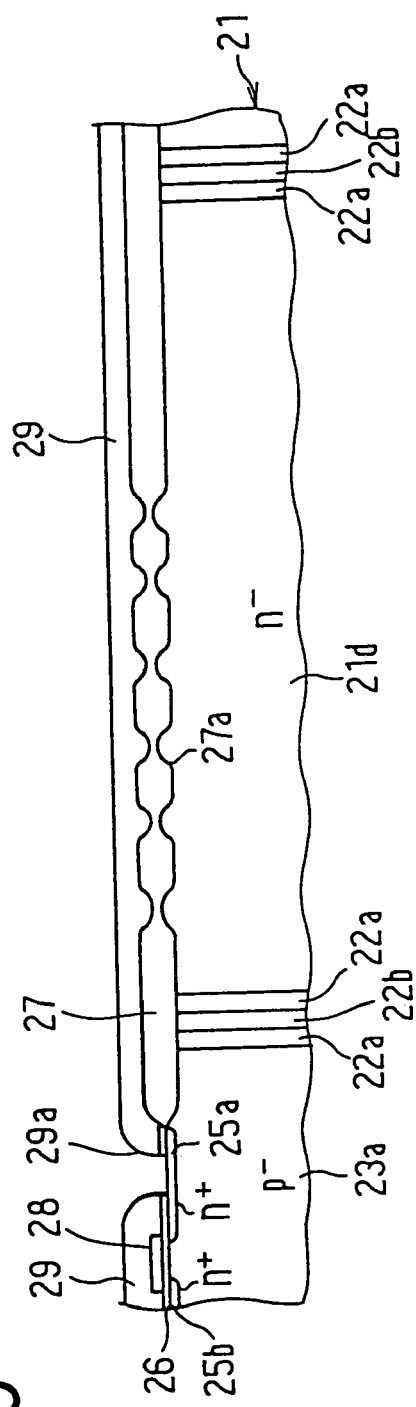

FIG. 18 shows a part of an integrated circuit of the MOSFET. A silicon substrate 21 is formed with a SOI (Silicon on Insulator) structure, in which a high impurity concentration n type layer 21c and a low impurity concentration n type layer 21d are provided on a high impurity concentration p type substrate 21a through a silicon oxide film 21b. A trench is formed in the silicon substrate 21, and is filled with a silicon oxide film 22a and a polysilicon layer 22b. Accordingly, an element (MOSFET) formation region 23 and a thin film resistor formation region 24 are isolated from each other.

In the element formation region 23, a p type well layer 23a is formed by implanting p type impurities into the n⁻ type layer 21d, and n type source region 25a and an n type drain region 25b are provided in a surface region of the p type well layer 23a. A gate oxide film 26 is formed on the surface of the p type well layer 23a between the source region 25a and the drain region 25b. A LOCOS film 27 is formed on the surface of the silicon substrate 21 to isolate the thin film resistor formation region 24 from the element formation region 23. A gate electrode 28 is formed on the gate oxide film 26, and the gate electrode 28 is covered with a BPSG insulation film 29. The source region 25a and the drain region 25b are electrically connected to a TiN film 30 and an AlSiCu film 31 as a 1st Al film (source electrode and drain electrode) through contact holes. Incidentally, wiring patterns 32a, 32b provided on the BPSG film 29 within the thin film resistor formation region 29 are formed simultaneously when the AlSiCu film 31 is formed.

The gate electrode 28 and the source (drain) electrode 31 are covered with a P—SiN film 33, a TEOS film 34, a SOG (Spin on Glass) 35, and a silicon oxide film 36. Then, a thin film resistor 37 is disposed at a specific position on the silicon oxide film 36. The thin film resistor 37 is composed of a CrSi film with a thickness of approximately 15 nm. The LOCOS film 27 has an irregularly shaped part 27a which underlies the thin film resistor 37 for scattering laser beam when laser trimming is performed to adjust a value of resistance of the thin film resistor 37. The irregularly shaped part 27a prevents interference of the leaser beam and the like so that the thin film resistor 37 can be desirably fused and cut.

A barrier metal 38 is disposed on both ends of the thin film resistor 37, and an Al thin film 39 as electrodes is disposed on the barrier metal 38 through an alloy layer 38b, which is transformed from a surface oxide layer 38a as described below. The surface oxide layer 38a is formed by, for instance, oxidizing the barrier metal 38. This surface oxide layer 38 prevents the Al thin film 39 and the barrier metal 38 from being inversely tapered by wet-etching for patterning the Al thin film 39 and the barrier metal 38. The surface oxide layer 38a is alloyed with the Al thin film 39 during a heat treatment (for instance, Al sintering) for patterning the barrier metal 38, thereby transforming into the alloy layer 38b having high conductivity.

Further, a silicon oxide film 40 is formed as an intermediate insulation film to cover the entire surface of the silicon substrate 21. An Al thin film 41 is formed as a 2nd Al film to form a wiring pattern filling via holes 40a defined in the silicon oxide film 40. The upper surface of the silicon substrate 21 including the Al thin film 41 is entirely covered with a protective film 42 composed of a P—SiN film.

Next, a method of manufacturing the integrated circuit of the MOSFET will be explained referring to FIGS. 19–29. First, at a step shown in FIG. 19, the silicon substrate 21 in which the high impurity concentration n type layer 21c and the low impurity concentration n type layer 21d are disposed on the high impurity concentration p type substrate 21a through the silicon oxide film 21b is prepared. Then, the trench is formed to reach the silicon oxide film 21b at the interface between the elements. The silicon oxide film 22a is disposed on the side wall of the trench, and the gap defined by the silicon oxide film 22a is filled with the polysilicon layer 22b, thereby forming the element isolation structure.

Next, selective ion implantation is carried out so that the p type well layer 23a is formed in the surface region of the n⁻ type layer 21d in the MOSFET formation region 23. Then, the LOCOS oxide film 27 is formed on the trench by LOCOS oxidation to have the irregularly shaped part 27a in the thin film resistor formation region for improving the workability of the laser trimming for the thin film resistor 37 (see FIG. 18).

After the gate oxide film 26 is formed on the p type well layer 23a, polysilicon is deposited thereon. The gate electrode 28 is formed by patterning the polysilicon. Then, ion implantation is carried out using the gate electrode 28 as a mask, and then a heat treatment is performed. Consequently, the source region 25a and the drain region 25b are formed. After that, the BPSG film 29 is formed on the entire surface of the silicon substrate 21 as an intermediate insulation film by a CVD method or the like. At a step shown in FIG. 20, after a contact hole 29a is formed in the BPSG film 29, a reflow treatment is carried out at a temperature in a range of approximately 900° C. to 950° C. to make an edge portion of the contact hole 29a smooth.

Figure 21:
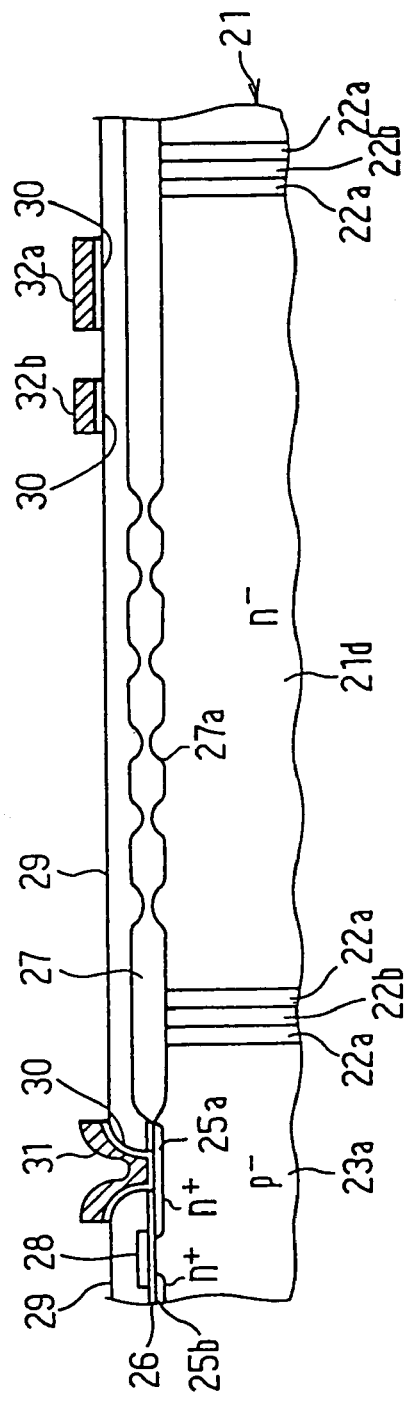

Then, at a step shown in FIG. 21, the TiN film 30 as barrier metal is formed with a thickness of approximately 100 nm. Then, after the AlSiCu film is deposited with a thickness of approximately 0.45 μm, the 1st Al film 31 is patterned by ECR (Electron cyclotron resonance) dry etching.

Figure 22:
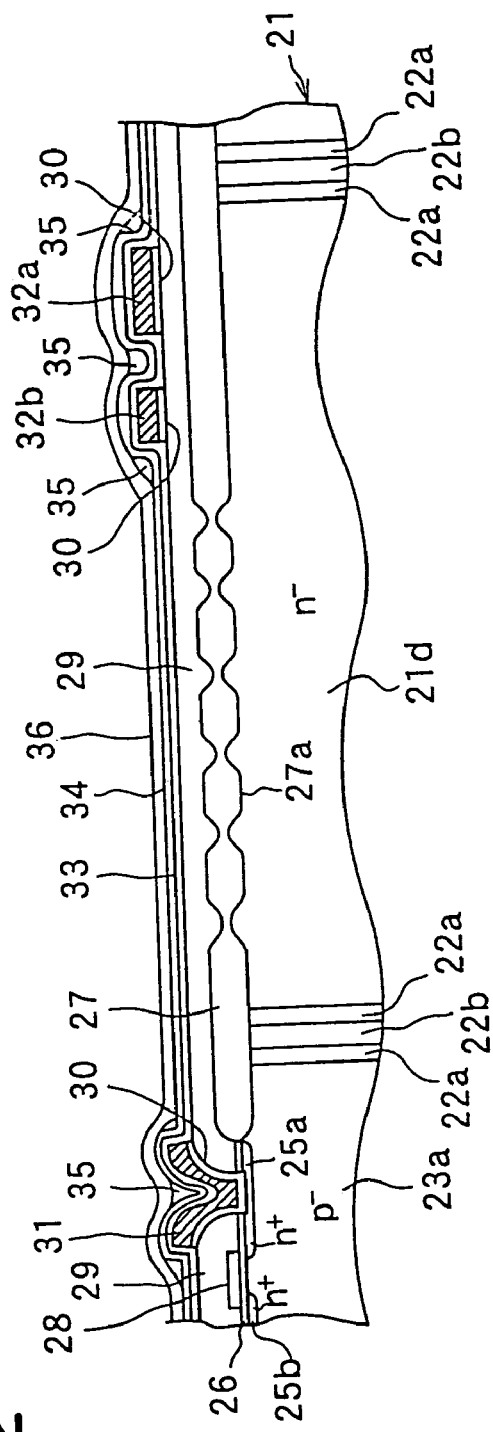

At a step shown in FIG. 22, after the P—SiN film 33 is deposited, the first TEOS film 34 is formed with a thickness of approximately 0.2 μm. Further, after coating the SOG, the irregular portion of the surface of the silicon substrate 21 is filled with the SOG 35 by baking and etch-back treatments so that the surface of the silicon substrate 21 is flattened. Further, the second TEOS film 36 is deposited with a thickness of approximately 0.3 μm by the CVD method.

Figure 23:
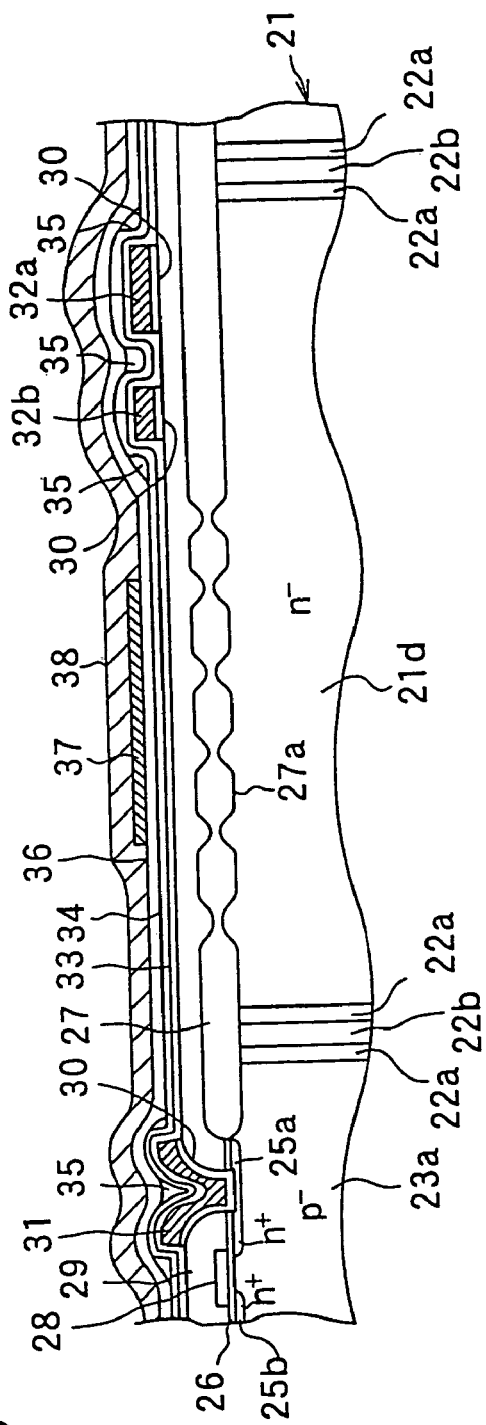

Then, at a step shown in FIG. 23, the CrSi film is deposited by sputtering with a thickness of approximately 15 nm, and is patterned to form the thin film resistor 37. Further, the barrier metal 38 composed of a TiW film is deposited on the enter surface of the silicon substrate 21 including the thin film resistor 27 with a thickness of approximately 1000 Å.

Figure 24:
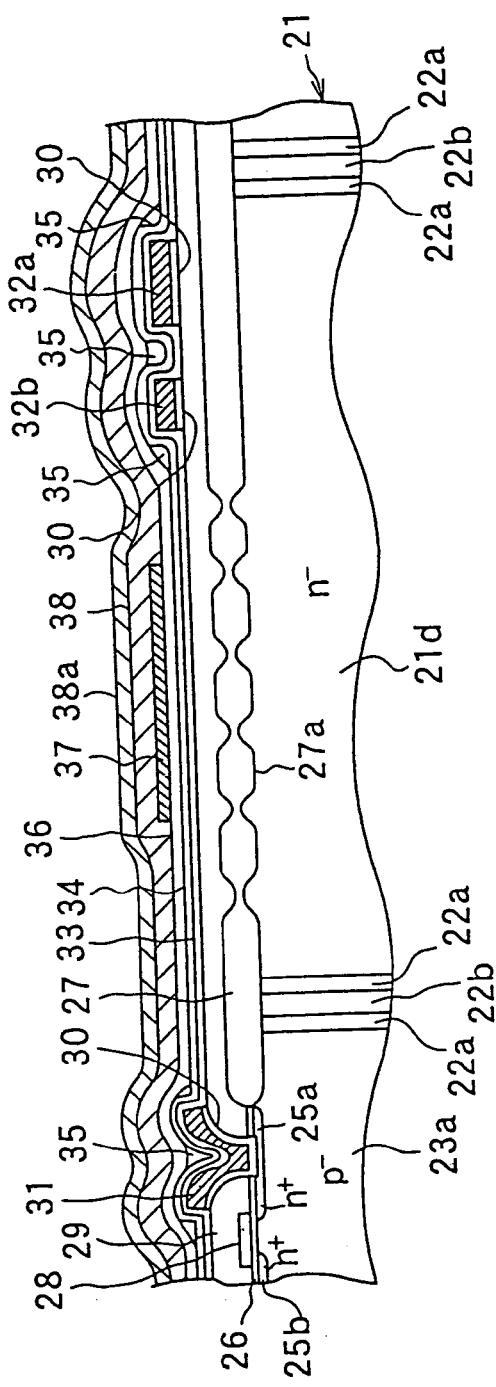
Figure 25:
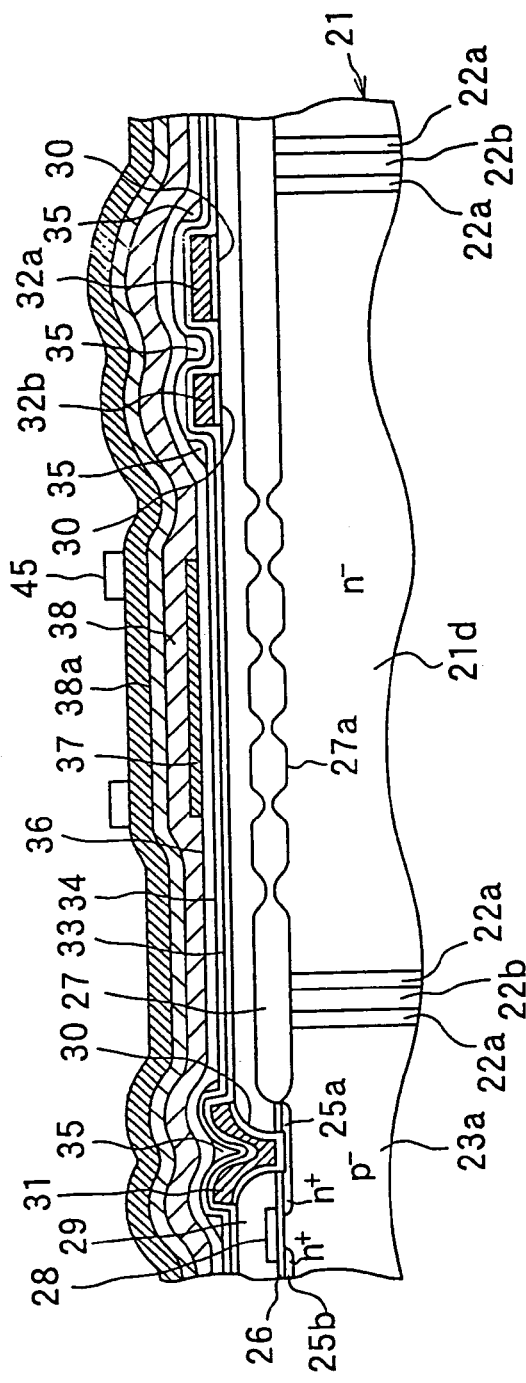

After that, at a step shown in FIG. 24, the surface of the barrier metal 38 undergoes an oxidation treatment including water cleaning, heat treatment, O₂ ashing, and the like, thereby forming the surface oxide layer 38a on the surface of the barrier metal 38. The surface oxide layer 38 is composed of a TiO₂ layer. Next, at a step shown in FIG. 25, an Al film for forming the electrodes of the thin film resistor 37 is deposited with a thickness of approximately 2000 Å. Then, a patterned photo-resist 45 is disposed on both ends of the thin film resistor 37 for performing a photo-lithography step.

Figure 26:
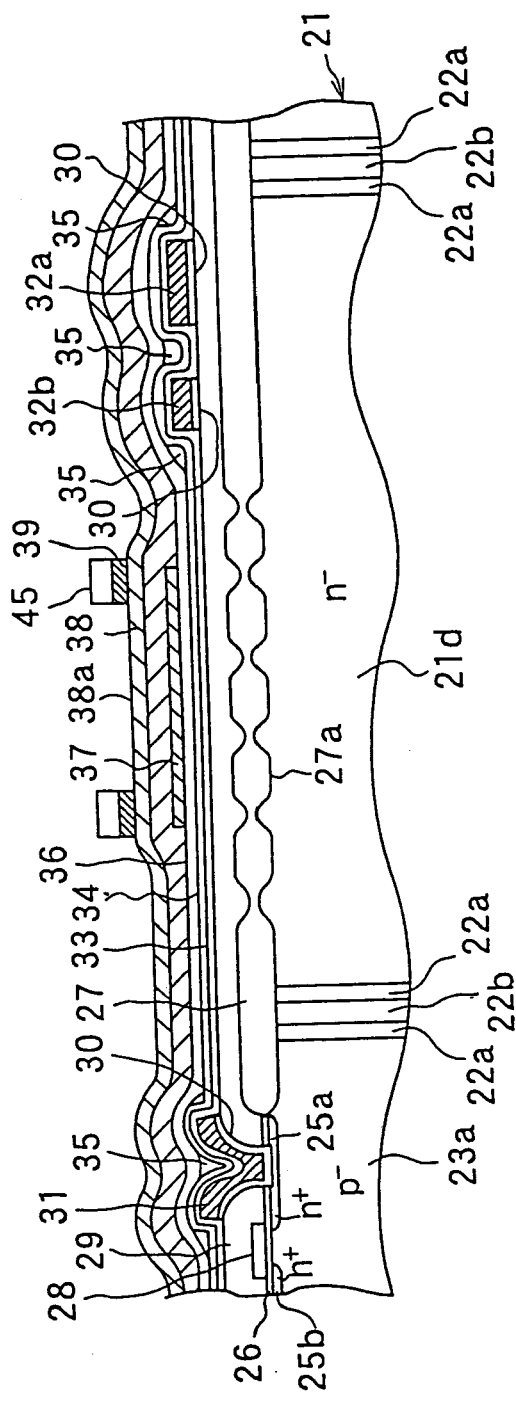
Figure 27:
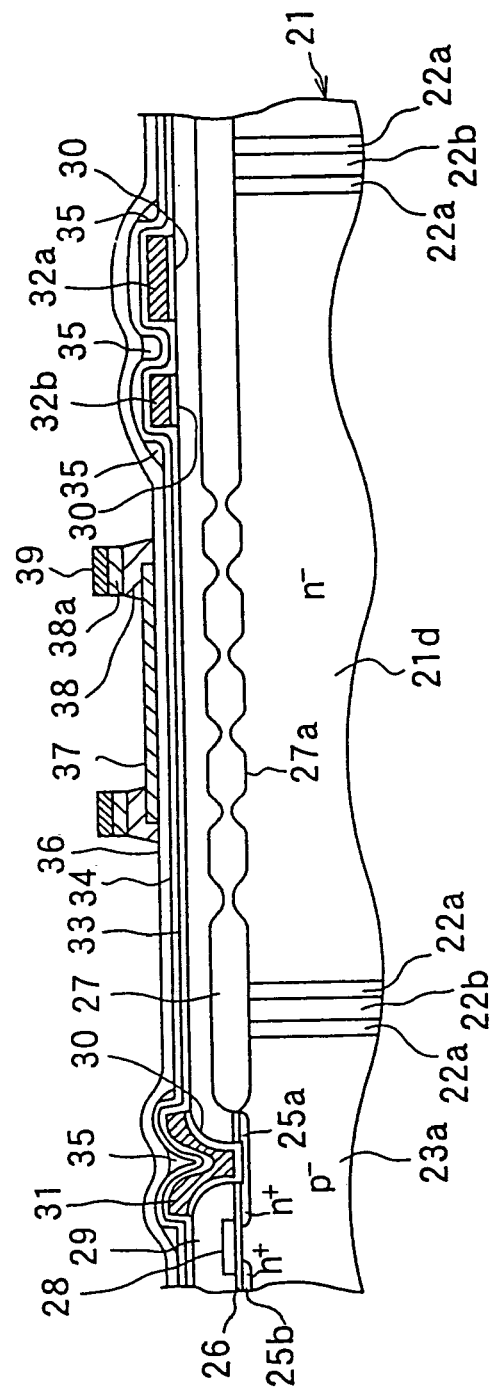

At a step shown in FIG. 26, the Al film is patterned to form the Al thin film 39 by wet etching using the photo-resist 45 as a mask. Successively, at a step shown in FIG. 27, the surface oxide layer 38a and the barrier metal 38 are patterned by wet etching using the photo-resist 45 as a mask again. In this wet etching, $H_2O_2/NH_4OH$ based solution is used. Therefore, a high etching rate can be realized to prevent the photo-resist 45 from floating.

At that time, because the surface oxide film 38a is formed on the surface of the barrier metal 38 at the step shown in FIG. 24, a potential difference produced between the Al thin film 39 and the barrier metal 38 during the wet etching is decreased. Specifically, the surface oxide layer 38a intervening between the Al thin film 39 and the barrier metal 38 serves as a barrier for disturbing a flow of electrons between the Al thin film 39 and the barrier metal 38, thereby reducing the potential difference therebetween. Consequently, the battery effect caused by the potential difference between the Al thin film 39 and the barrier metal 38 is reduced to prevent the Al etching rate around the interface of the barrier metal 38 from becoming large. Therefore, the Al thin film 39 is not inversely tapered by the wet etching. After that, the photo-resist 45 is removed.

Figure 28:
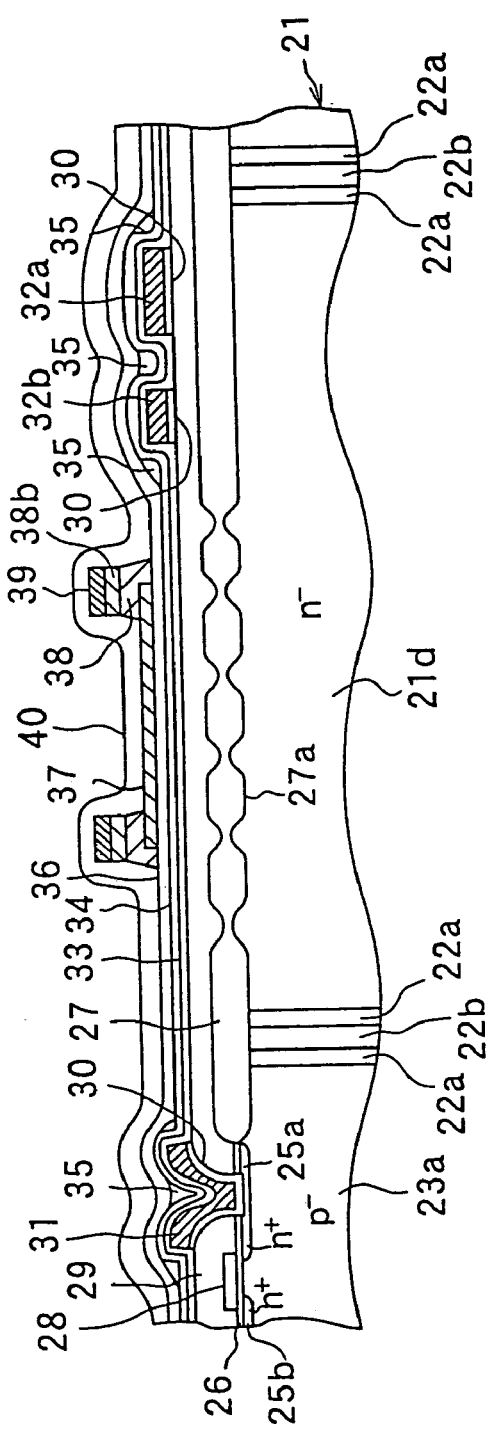

Next, at a step shown in FIG. 28, the surface of the silicon substrate 21 is entirely covered with the silicon oxide ($SiO_2$) film 40. Because the Al thin film 39 is not inversely tapered, the silicon oxide film 40 is not inversely tapered as well. Then, Al sintering is carried out at 450° C. for 30 min. so that the $TiAl_3$ alloy layer 38b is formed at the interface between the Al thin film 39 and the barrier metal 38 as a result of reaction ($Al+TiO_2 \rightarrow TiAl_3$) between the Al thin film 39 and the surface oxide layer 38a. $TiAl_3$ constituting the $TiAl_3$ alloy layer 38b is formed by a heat treatment in a range of approximately 400° C. to 500° C. The $TiAl_3$ alloy layer 38b improves the contact property between the barrier metal 38 and the Al thin film 39.

Figure 29:
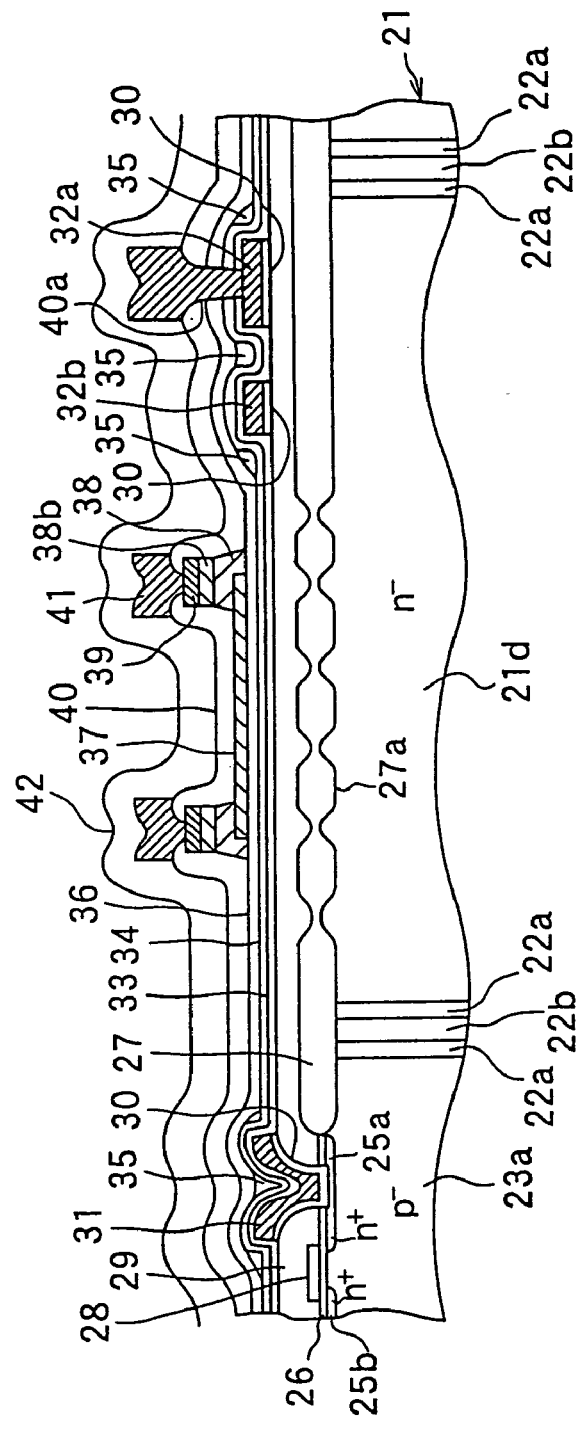
Figure 30:
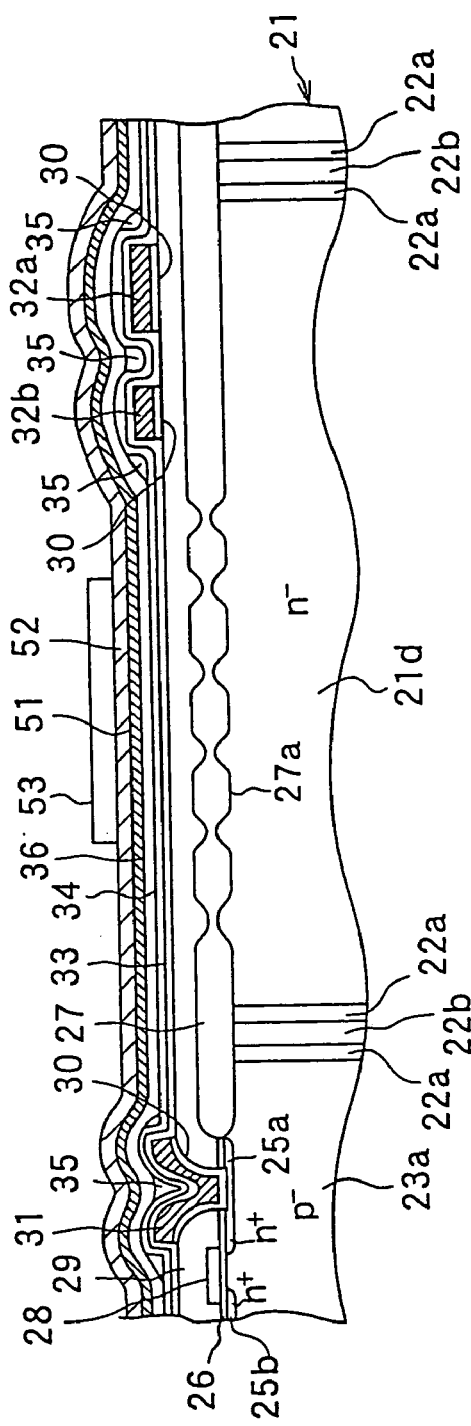
FIG. 30 to 33 are cross-sectional view showing a method of manufacturing the integrated circuit in a stepwise manner in a fourth preferred embodiment.

Then, at a step shown in FIG. 29, after the via holes 40a are formed in the silicon oxide film 40, the patterned AlSi film 41 as the 2nd Al film is disposed in the via holes 40a. At that time, because the silicon oxide film 40 is not inversely tapered, the AlSi film 41 can be formed with a desirable pattern without having breakage.

Further, the upper surface of the silicon substrate 21 including the AlSi film 40 is entirely covered with the protective film 42 composed of a P—SiN film, and an annealing treatment is carried out. This annealing treatment can improve the contact property between the surface oxide layer 38a and the Al thin film 39 as well as the Al sintering performed at the step shown in FIG. 28. Therefore, the thickness of the surface oxide film 38a is preferably controlled to be almost reacted by these treatments.

Thus, the surface oxide layer 38a intervening between the Al thin film 39 and the barrier metal 38 prevents the Al thin film 39 from being inversely tapered, and accordingly, the breakage of the wiring pattern (AlSi film 41) formed on the Al thin film 39 does not occur. Further, the contact property between the surface oxide layer 38a and the Al thin film 39 is improved by the heat treatment.

Fourth Embodiment

A fourth preferred embodiment differs from the third embodiment in a method for patterning the barrier metal 38. Only points different from the method of the third embodiment will be explained referring to FIGS. 30–33.

First, the steps shown in FIGS. 19–22 are successively performed as in the third embodiment. Then, at a step shown in FIG. 30, a CrSi film 51 is deposited by sputtering with a thickness of approximately 15 nm, and a TiW film 52 is deposited on the CrSi film 51 with a thickness of approximately 1000 Å. Then, a photo-resist 53 is deposited, and is patterned to remain only at a portion where a thin film resistor 37 (see FIG. 18) is to be formed.

Figure 31:
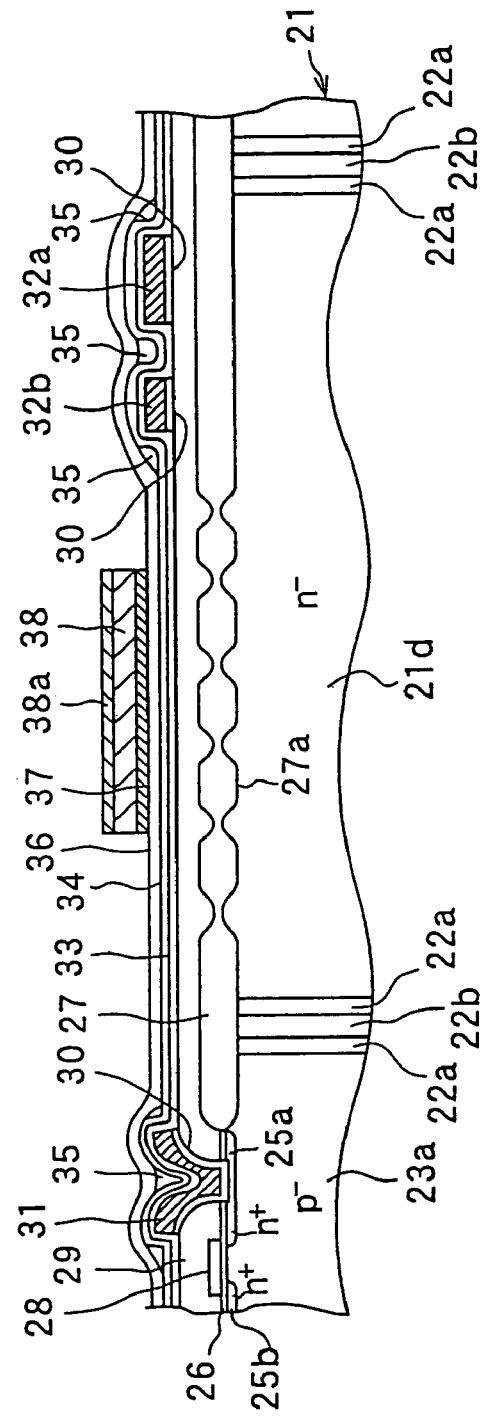

At a step shown in FIG. 31, the CrSi film 51 is patterned together with the TiW film 52. Accordingly, the thin film resistor 37 and the barrier metal 38 are formed. After that, water cleaning, heat treatment, $O_2$ ashing, and the like are performed to oxidize the surface of the barrier metal 38, thereby forming the surface oxide layer 38a. The surface oxide layer is made of $TiO_2$.

Figure 32:
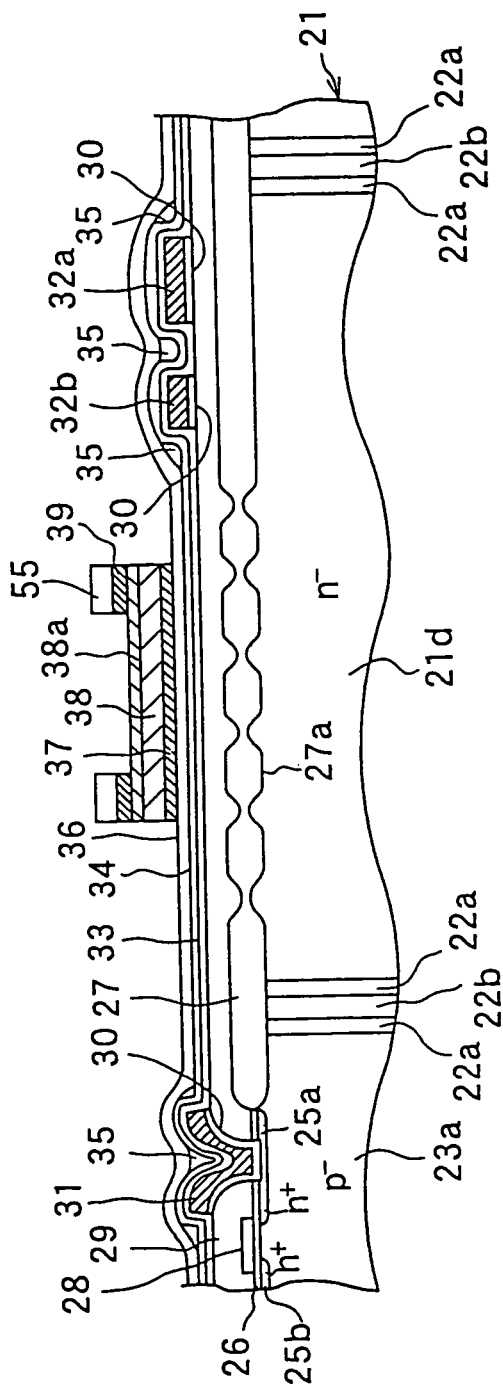
Figure 33:
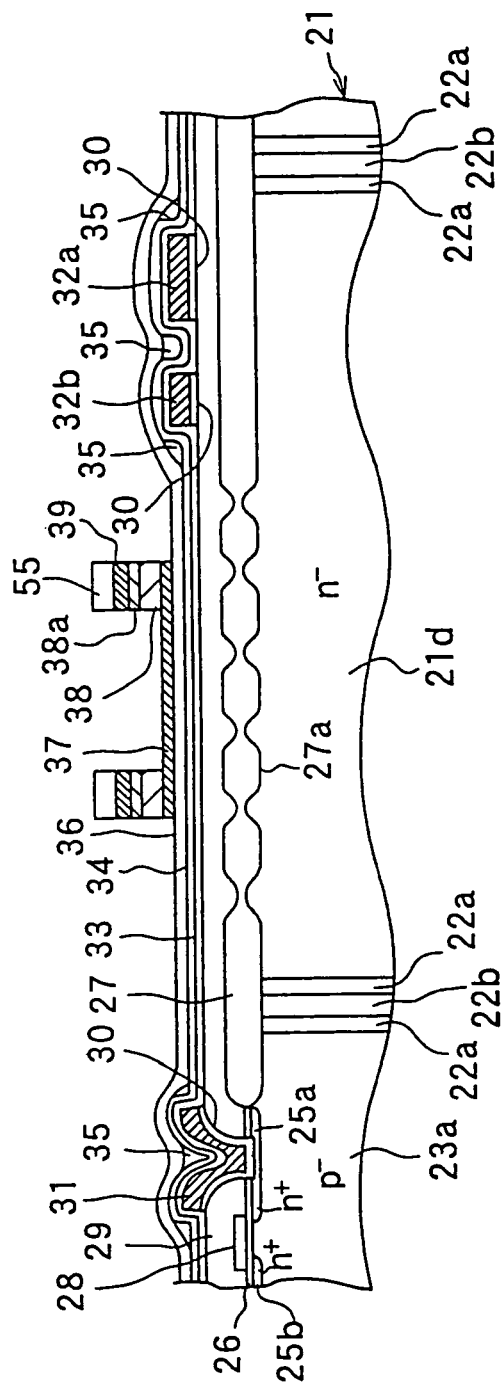

Next, at a step shown in FIG. 32, the Al thin film 39 are deposited with a thickness of approximately 2000 Å as electrodes for the thin film resistor. A photo-resist 55 is formed and is patterned to remain on both end portions of the thin film resistor 37 for performing a photo-lithography step. After that, dry etching is performed using the photo-resist 55 as a mask so that the Al thin film 39 is patterned. At a step shown in FIG. 33, wet etching is further performed using the photo-resist 55 as a mask again, so that the surface oxide layer 38a and the barrier metal 38 are patterned. The wet etching uses $H_2O_2/NH_4OH$ based etching solution. At that time, because the surface oxide layer 38a is formed on the surface of the barrier metal 38 at the step shown in FIG. 31, the Al thin film 39 is not inversely tapered as in the third embodiment. Then, the integrated circuit of the MOSFET is finished through the steps shown in FIGS. 18–19. Thus, even when the thin film resistor 37 and the barrier metal 38 are patterned using the identical mask, the same effects as those in the third embodiment can be provided. The third and fourth embodiments can be combined with the first and second embodiments to enhance the effects described above.

Although the present invention is applied to prevent the under-cut of the barrier metal and the over-hanging of the Al thin film in the method of manufacturing the semiconductor device with the thin film resistor, it can be widely applied to prevent dissolution (elution) of a metallic layer by a battery effect. Specifically, in a case where two laminated metallic films are exposed to a solution to produce an electrode potential difference therebetween which can cause a battery effect in the solution to dissolve one of the metallic layers, the above-described present invention can be applied to prevent the dissolution of the one of the metallic layers. Therefore, the present invention is not necessarily applied to an wet-etching step, and is sufficient to be applied to a wet-processing step using a specific solution to provide the effects described above.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method of etching a metallic film, comprising the steps of:
    forming a metallic film on a thin film resistor;
    forming a conductive film on the metallic film to have an opening exposing the metallic film therefrom and a thickness equal to or less than 300 nm;
    patterning the conductive film so that the conductive film has an upper surface area, a ratio of which relative to an upper surface area of the thin film resistor is equal to or more than 0.02; and
    etching the metallic film through opening of the conductive film; wherein
    the metallic film is etched using an etching solution in which the metallic film has an ionization tendency larger than that of the thin film resistor and smaller than that of the conductive film.

2. A method of etching a metallic film, comprising the steps of:
forming a metallic film on a thin film resistor;
forming a conductive film on the metallic film to have an opening exposing the metallic film therefrom and a thickness equal to or less than 300 nm;
patterning the conductive film so that the conductive film has an upper surface area, a ratio of which relative to an upper surface area of the thin film resistor is equal to or more than 0.02; and
etching the metallic film through opening of the conductive film; wherein
the metallic film is etched using an etching solution including $NH_4OH$, $H_2O_2$ and $H_2O$, a composition ratio of which is 5:100:400, and
the metallic film in the etching solution has an ionization tendency larger than that of the thin film resistor and smaller than that of the conductive film.

3. The method of claim 2, further comprising decreasing a battery effect between the metallic film and the thin film resistor.

4. A method of etching a metallic film, comprising the steps of:
forming a metallic film on a thin film resistor;
forming a conductive film on the metallic film to have an opening exposing the metallic film therefrom and a thickness equal to or less than 300 nm;
patterning the conductive film so that the conductive film has an upper surface area, a ratio of which relative to an upper surface area of the thin film resistor is equal to or more than 0.02; and
etching the metallic film through opening of the conductive film; wherein
the metallic film is etched using an etching solution including $NH_4OH$, $H_2O_2$, and $H_2O$, a composition ration of which is 5:100:400.

5. The method of claim 4, wherein the conductive film is patterned so that said ratio becomes less than 2.0.

6. The method of claim 4, wherein:
the step of patterning the conductive film includes a step of disposing a resist having a specific shape on the conductive film, and a step of etching the conductive film through the resist; and
the metallic film is etched through the conductive film holding the resist thereon.

7. A method of etching a metallic film, comprising the steps of:
forming a metallic film on a thin film resistor;
forming a conductive film on the metallic film to have an opening exposing the metallic film therefrom and a thickness equal to or less than 300 nm;
patterning the conductive film so that the conductive film has an upper surface area, a ratio of which relative to an upper surface area of the thin film resistor is equal to or more than 0.02; and
etching the metallic film through opening of the conductive film; wherein
in the step of etching the metallic film, the metallic film is not substantially undercut and the conductive film does not substantially hang over the metallic film.

8. A method of etching a metallic film, comprising the steps of:
forming a metallic film on a thin film resistor;
forming a conductive film on the metallic film to have an opening exposing the metallic film therefrom and a thickness equal to or less than 300 nm;
patterning the conductive film so that the conductive film has an upper surface area, a ratio of which relative to an upper surface area of the thin film resistor is equal to or more than 0.02;
etching the metallic film through opening of the conductive film; and,
decreasing a battery effect between the metallic film and the thin film resistor.

* * * * *